US010915025B2

(12) United States Patent
Fukumoto et al.

(10) Patent No.: US 10,915,025 B2
(45) Date of Patent: Feb. 9, 2021

(54) SUBSTRATE TREATING METHOD

(71) Applicant: SCREEN Holdings Co., Ltd., Kyoto (JP)

(72) Inventors: Yasuhiro Fukumoto, Kyoto (JP); Yuji Tanaka, Kyoto (JP); Tomohiro Matsuo, Kyoto (JP); Takeharu Ishii, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 15/856,500

(22) Filed: Dec. 28, 2017

(65) Prior Publication Data

US 2018/0231895 A1   Aug. 16, 2018

(30) Foreign Application Priority Data

Feb. 14, 2017  (JP) ................................. 2017-025230

(51) Int. Cl.
 *G03F 7/40*  (2006.01)
 *G03F 7/00*  (2006.01)
 (Continued)

(52) U.S. Cl.
 CPC .............. *G03F 7/40* (2013.01); *G03F 7/0002* (2013.01); *G03F 7/70991* (2013.01);
 (Continued)

(58) Field of Classification Search
 CPC ...... G03F 7/40; G03F 7/0002; G03F 7/70991; H01L 21/68742; H01L 21/67109; H01L 21/67098; H01L 21/0338; H01L 21/0273
 See application file for complete search history.

(56) References Cited

U.S. PATENT DOCUMENTS 6,665,952 B2 * 12/2003 Nagashima ....... H01L 21/67103
34/391
2004/0058560 A1 * 3/2004 Ranish .................. H01L 21/324
438/795

(Continued)

FOREIGN PATENT DOCUMENTS

JP       2001-148379        5/2001
JP       2002-324790 A     11/2002

(Continued)

OTHER PUBLICATIONS

Office Action dated Aug. 20, 2018 in corresponding Taiwan Patent Application No. 107100897.

(Continued)

*Primary Examiner* — Edward Chin
(74) *Attorney, Agent, or Firm* — Ostrolenk Faber LLP

(57) ABSTRACT

Disclosed is a substrate treating method for treating a substrate with a directed self-assembly material applied thereto. The substrate treating method includes a heating step and a cooling step. The heating step includes heating the substrate to perform phase separation of the directed self-assembly material by maintaining an interior of a treatment container in a non-oxidizing gas atmosphere and placing the substrate at a heating position. The cooling step includes cooling the substrate by maintaining the interior of the treatment container in the non-oxidizing gas atmosphere, placing the substrate at a cooling position further away from the heating unit than the heating position, supplying non-oxidizing gas into the treatment container, and exhausting gas within the treatment container.

20 Claims, 8 Drawing Sheets

(51) Int. Cl.
  *H01L 21/67* (2006.01)
  *H01L 21/033* (2006.01)
  *H01L 21/687* (2006.01)
  *G03F 7/20* (2006.01)

(52) U.S. Cl.
  CPC .... *H01L 21/0338* (2013.01); *H01L 21/67098* (2013.01); *H01L 21/67109* (2013.01); *H01L 21/68742* (2013.01)

(56) References Cited

U.S. PATENT DOCUMENTS

| | | | |
|---|---|---|---|
| 2012/0269603 A1* | 10/2012 | Toba | H01L 21/67757 414/160 |
| 2014/0022521 A1 | 1/2014 | Harumoto et al. | 355/27 |
| 2014/0273522 A1 | 9/2014 | Rathsack | 438/781 |
| 2014/0273523 A1 | 9/2014 | Rathsack | 438/781 |
| 2014/0370718 A1* | 12/2014 | Chakrapani | H01L 21/67248 438/725 |
| 2015/0197594 A1 | 7/2015 | Xu et al. | |
| 2015/0228512 A1 | 8/2015 | Muramatsu et al. | |
| 2016/0293403 A1 | 10/2016 | Muramatsu et al. | |

FOREIGN PATENT DOCUMENTS

| | | |
|---|---|---|
| JP | 2006-040943 A | 2/2006 |
| JP | 2007-201077 A | 8/2007 |
| JP | 2014-022570 A | 2/2014 |
| JP | 2014-087781 A | 5/2014 |
| JP | 2016-518701 A | 6/2016 |
| KR | 10-2015-0127645 A | 11/2015 |
| KR | 10-2016-0017780 A | 2/2016 |
| KR | 10-2016-0088961 A | 7/2016 |
| TW | 201430905 | 8/2014 |
| TW | 201627333 | 8/2016 |
| TW | 201638166 A | 11/2016 |

OTHER PUBLICATIONS

Office Action dated Aug. 24, 2019 in corresponding Korean Patent Application No. 10-2018-0010610.
Office Action dated Dec. 8, 2020 in corresponding Japanese Patent Application No. 2017-025230.

* cited by examiner

SUBSTRATE TREATING METHOD

CROSS-REFERENCE TO RELATED APPLICATIONS

This application claims priority to Japanese Patent Application No. 2017-025230 filed Feb. 14, 2017, the disclosure of which is hereby incorporated herein by reference in its entirety for all purposes.

BACKGROUND OF THE INVENTION

Field of the Invention

The present invention relates to a substrate treating method for treating a substrate with a directed self-assembly material applied thereto. Examples of the substrate include a semiconductor wafer, a substrate for photomask, a substrate for liquid crystal display, a substrate for plasma display, a substrate for organic EL, a substrate for field emission display (FED), a substrate for optical display, a magnetic disk substrate, an optical disk substrate, an optical magnetic disk substrate, and a solar cell substrate.

Description of the Related Art

Japanese Patent Publication No. 2014-22570A discloses a substrate processing method for forming patterns on a substrate with a directed self assembly (DSA) technique. The substrate processing method includes an application step, a heating step, and a developing step. The application step performs application of a directed self-assembly material to the substrate. The directed self-assembly material contains two types of copolymers, for example. The heating step performs heating of the substrate while a solvent is supplied to the substrate, which step is hereunder referred to as a "solvent heat treatment" as appropriately. The solvent heat treatment causes phase separation of the directed self-assembly material. The directed self-assembly material subjected to the phase separation has a structure where the two types of copolymers are arranged regularly. The developing step causes one of the copolymers to remain on the substrate while the other of the copolymers to be removed from the substrate. This achieves pattern formation on the substrate that is formed by the one copolymer.

The heating step is performed within a heat treating unit. The heat treating unit includes a chamber, a plate, an inlet, and an outlet. The chamber is able to be sealed. The plate is disposed within the chamber. The plate heats the substrate. The inlet introduces the solvent into the chamber. The outlet exhausts gas within the chamber.

The following describes a procedure of the heating step. Firstly, the substrate is placed on the plate and the chamber is sealed. Then, the solvent heat treatment is performed to the substrate. Specifically, the solvent is supplied through the inlet into the chamber, the gas within the chamber is exhausted through the outlet, and the substrate is heated with the plate. The substrate is heated at temperatures controlled within a range of a room temperature or more and 250° C. or less. After a predetermined period of time elapses, the solvent within the chamber is replaced by inert gas. Specifically, the supply of the solvent to the chamber stops, and the inert gas is supplied into the chamber. Subsequently, the exhaust of the gas within the chamber stops. Thereafter, the chamber is opened to transport the substrate out of the chamber.

SUMMARY OF THE INVENTION

The degraded or uneven quality of the substrate treatment may arise even when the substrate is treated along with the currently-used example. For instance, a suitable pattern may not possibly be formed on the substrate even when the substrate is treated along with the currently-used example. This is considered to be caused from inappropriate phase separation of the directed self-assembly material.

The present invention has been made regarding the state of the art noted above, and its one object is to provide a substrate treating method that allows the directed self-assembly material to undergo appropriate phase separation.

Inventors of the present application have attempted to change procedures and conditions in the heating step. Specifically, the Inventors have attempted to heat the substrate without supplying the solvent to the substrate instead of performing the solvent heat step, which is hereunder referred to as a "simple heating treatment" where appropriate. As a result, the Inventors have attained the following findings. That is, the simple heat treatment also led to degradation or variation in treatment quality. Moreover, the degradation or the variation in treatment quality occurred largely through the simple heating treatment to the substrate at higher temperatures (e.g., 300° C. or more).

Based on these findings, the Inventors have made more study to the substrate treating method that allows satisfied phase separation of the directed self-assembly material even when the substrate with the directed self-assembly material applied thereto is heated at high temperatures.

The present invention based on the above attempting, findings and study adopts the following configuration. One aspect of the present invention provides a substrate treating method for treating a substrate with a directed self-assembly material applied thereto. The substrate treating method includes a heating step and a cooling step. In the heating step, the substrate is heated to perform phase separation of the directed self-assembly material by maintaining an interior of a treatment container in a non-oxidizing gas atmosphere and placing the substrate at a heating position where the substrate contacts or is adjacent to a heating unit within the treatment container. In the cooling step, the substrate is cooled by maintaining the interior of the treatment container in the non-oxidizing gas atmosphere, placing the substrate at a cooling position further away from the heating unit than the heating position, supplying non-oxidizing gas into the treatment container, and exhausting gas within the treatment container.

In the heating step, the interior of the treatment container is maintained at the non-oxidizing gas atmosphere, and the substrate is placed at the heating position. Accordingly, the heating step heats the substrate at the non-oxidizing gas atmosphere. Consequently, the heating step allows the directed self-assembly material to undergo appropriate phase separation while preventing oxidization of the directed self-assembly material on the substrate.

In the cooling step, the interior of the treatment container is maintained at the non-oxidizing gas atmosphere, and the substrate is disposed at the cooling position. In addition, the non-oxidizing gas is supplied into the treatment container and the gas within the treatment container is exhausted. Accordingly, the cooling step cools the substrate at the non-oxidizing gas atmosphere. Here, the cooling step maintains the interior of the treatment container at the non-oxidizing gas atmosphere, and places the substrate at the cooling position, leading to an appropriately maintained structure of the phase separated directed self-assembly material. Specifically, this allows suitably prevention of degradation or collapse in structure of the phase separated directed self-assembly material. Since the substrate treating method includes the cooling step mentioned above, the structure of the phase separated directed self-assembly material is suitably protectable even when the heating step heats the substrate at high temperatures.

As above, since the substrate treating method includes the heating step and the cooling step, the directed self-assembly material is able to undergo suitable phase separation even when the substrate with the directed self-assembly material applied thereto is heated at high temperatures.

In addition, the cooling step supplies the non-oxidizing gas into the treatment container, and exhausts the gas within the treatment container. This allows the cooling step to perform short-time cooling of the substrate.

It is preferred in the above aspect of the substrate treating method that the cooling step includes cooling the substrate to a temperature equal to or less than a glass transition point of the directed self-assembly material. In the cooling step, the substrate is cooled at the non-oxidizing gas atmosphere to a temperature equal to or less than the glass transition temperature of the directed self-assembly material. Consequently, the structure of the phase separated directed self-assembly material is able to be maintained suitably not only during but also after the cooling step.

In the substrate treating method mentioned above, the following is preferred. That is, the directed self-assembly material contains a first copolymer and a second copolymer. The heating step includes undergoing phase separation to the first copolymer and the second copolymer. The cooling step includes cooling the substrate to a temperature equal to or less than at least either a glass transition point of the first copolymer or a glass transition point of the second copolymer. In the heating step, the first copolymer and the second copolymer are phase-separated from each other. This causes the structure of the directed self-assembly material having the first copolymer and the second copolymer arranged regularly. In the cooling step, the substrate is cooled at the non-oxidizing gas atmosphere to a temperature equal to or less than at least either the glass transition temperature of the first copolymer or the glass transition temperature of the second copolymer. Consequently, the structure where the first copolymer and the second copolymer are arranged regularly is able to be maintained suitably not only during but also after the cooling step.

It is preferred in the substrate treating method mentioned above that the heating step includes heating the substrate to a temperature of 300° C. or more. Even when the heating steps heats the substrate to a temperature of 300° C. or more, the substrate treating method allows suitable protection of the structure of the phase separated directed self-assembly material. As noted above, the substrate treating method exerts an especially high utility when the heating step heats the substrate at high temperatures.

It is preferred in the substrate treating method mentioned above that the cooling step includes keeping an oxygen concentration within the treatment container at 10,000 ppm or less. This causes the cooling step to protect the structure of the phase separated directed self-assembly material more suitably.

It is preferred in the substrate treating method mentioned above that the cooling step includes keeping an oxygen concentration within the treatment container at 1,000 ppm or less. This causes the cooling step to protect the structure of the phase separated directed self-assembly material more suitably.

It is preferred in the substrate treating method mentioned above that the non-oxidizing gas is inert gas. Since the heating step heats the substrate under an inert gas atmosphere, the heating step allows suitable prevention of the directed self-assembly material on the substrate from oxidization. Moreover, since the cooling step cools the substrate under the inert gas atmosphere, the cooling step allows suitable protection of the structure of the phase-separated directed self-assembly material.

It is preferred in the substrate treating method mentioned above that the non-oxidizing gas is supplied in the cooling step by an amount larger than an amount of non-oxidizing gas in the heating step. This achieves cooling of the substrate in the cooling step in a shorter time.

It is preferred in the substrate treating method mentioned above that the gas within the treatment container is exhausted in the cooling step by an amount larger than an amount of gas within the treatment container in the heating step. This achieves cooling of the substrate in the cooling step in a shorter time.

It is preferred in the substrate treating method mentioned above that pressure within the treatment container in the cooling step is negative. Since the pressure within the treatment container in the cooling step is negative, connecting parts of the treatment container are sealed more airtightly, leading to higher air tightness of the treatment container. Consequently, the cooling step allows the interior of the treatment container to be kept at the non-oxidizing gas atmosphere more easily.

It is preferred in the substrate treating method mentioned above that the heating position is a position where the substrate contacts a top face of the heating unit or is adjacent to the top face of the heating unit, and the cooling position is above the heating position. Since the heating position is a position where the substrate contacts or is adjacent to the top face of the heating unit, the heating unit allows suitable heating of the substrate when the substrate is located at the heating position. Since the cooling position is above the heating position, the cooling position is further away from the heating unit than the heating position. Consequently, the substrate is able to be cooled suitably when the substrate is located at the cooling position.

It is preferred in the substrate treating method mentioned above that the cooling step includes blowing the non-oxidizing gas from an upper supply port above the substrate in the cooling position. Since the upper supply port is disposed above the cooling position, the upper supply port allows suitable blowing of the non-oxidizing gas toward the substrate in the cooling position. Consequently, the cooling step allows efficient cooling of the substrate in the cooling position.

It is preferred in the substrate treating method mentioned above that the cooling step includes blowing the non-oxidizing gas from a heating unit supply port formed on the top face of the heating unit. Since the heating unit supply port is disposed on the top face of the heating unit, the heating unit supply port allow suitable blowing of the non-oxidizing gas toward above the heating unit. This efficiently suppresses stagnation gas above the heating unit. Consequently, the cooling step allows more efficient cooling of the substrate.

It is preferred in the substrate treating method mentioned above that the cooling step includes exhausting the gas within the treatment container through a lateral outlet disposed laterally of the substrate in the cooling position. Since the lateral outlet is disposed laterally of the cooling position, the lateral outlet allows smooth exhaust of the gas around the substrate. Consequently, the cooling step allows more efficient cooling of the substrate.

It is preferred in the substrate treating method mentioned above that the lateral outlet has a width larger than a width of the substrate. Accordingly, the lateral outlet allows more smooth exhaust of the gas around the substrate. Consequently, the cooling step allows more efficient cooling of the substrate.

It is preferred in the substrate treating method mentioned above that the cooling step includes exhausting the gas within the treatment container through a heating unit outlet formed on the top face of the heating unit. Since the heating unit outlet is on the top face of the heating unit, the heating unit outlet allows exhaust of the gas above the heating unit. This efficiently suppresses stagnation gas above the heating unit. Consequently, the cooling step allows more efficient cooling of the substrate.

The following is preferred in the substrate treating method mentioned above. That is, the treatment container includes a casing with a transportation port through which the substrate passes, and a shutter that is removably attached to the casing to open/close the transportation port. The substrate treating method includes a loading step of loading the substrate into the treatment container through the transportation port, a sealing step of sealing the transportation port with the shutter, and a replacing step of replacing the gas within the treatment container by non-oxidizing gas. The heating step and the cooling step are performed after the replacing step while the transportation port is sealed. Since the treatment container includes the shutter, the transportation port is able to be sealed suitably. In the substrate treating method, the replacing step is performed after the sealing step (i.e., after the transportation port is sealed). Consequently, the replacing step allows easy replacement of the gas within the treatment container by the non-oxidizing gas. In the substrate treating method, the heating step is performed while the transportation port is sealed. Consequently, the heating step allows the interior of the treatment container to be kept at the non-oxidizing gas atmosphere easily. Moreover, in the substrate treating method, the cooling step is performed while the transportation port is sealed. Consequently, the cooling step allows the interior of the treatment container to be kept at the non-oxidizing gas atmosphere easily.

It is preferred that the substrate treating method includes an opening step of opening the transportation port, and an unloading step of unloading the substrate from the treatment container through the transportation port, and it is preferred that the opening step is performed after the cooling step. In the substrate treating method, the opening step is not performed until the cooling step is completed. In other words, in the substrate treating method, the cooling step is performed while the transportation port is sealed. Consequently, the cooling step allows the interior of the treatment container to be kept at the non-oxidizing gas atmosphere easily.

It is preferred in the substrate treating method mentioned above that the cooling step includes cooling the substrate to a temperature equal to or less than a temperature at which a structure of the phase separated directed self-assembly material does not degrade or collapse substantially even when the substrate contacts the gas whose oxygen concentration is almost equal to an oxygen concentration of air. When the substrate has a temperature of a certain value or less, the structure of the phase separated directed self-assembly material does not degrade or collapse even if the substrate contacts the gas whose oxygen concentration is substantially equal to that of air. In the substrate treating method, the cooling step cools the substrate at the non-oxidizing gas atmosphere until the temperature of the substrate is decreased to the value such above. Consequently, the structure of the phase separated directed self-assembly material is able to be maintained suitably not only during but also after the cooling step.

It is preferred in the substrate treating method mentioned above that the heating step includes heating of the substrate at a temperature higher than a glass transition point of the directed self-assembly material on the substrate. In the substrate treating method, the structure of the phase separated directed self-assembly material is suitably protectable even when the substrate is heated in the heating step at the temperature higher than the glass transition temperature of the directed self-assembly material. As noted above, the substrate treating method exerts an especially high utility when the substrate at is heated at the high temperatures in the heating step.

The disclosure also provides another embodiment as under according to the substrate treating method of the present invention.

(1) In the substrate treating method mentioned above, the cooling step includes maintaining the oxygen concentration within the treatment container at 100 ppm or less.

According to the substrate treating method described in the above (1), the cooling step allows more suitable protection of the structure of the phase separated directed self-assembly material.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

The following describes embodiments of the present invention with reference to drawings. A substrate treating method according to the present embodiment heats and cools a substrate (e.g., a semiconductor wafer) W with a directed self-assembly material applied thereto. The substrate W is heated, whereby the directed self-assembly material is phase separated. The phase separated directed self-assembly material has a structure with high regularity. Thereafter, the substrate W is cooled, whereby the structure of the phase separated directed self-assembly material is protected from degradation or collapse.

1. Directed Self-Assembly Material

The directed self-assembly material contains two types of copolymers. Heating the substrate W causes phase separation of the two copolymers. Such phase separation leads to copolymers regularly arranged.

The directed self-assembly material may be a chemical compound generated by combination of two types of copolymers (i.e., a block copolymer). The block copolymer may be a diblock copolymer or a triblock copolymer. Alternatively, the directed self-assembly material may be a blend of two types of copolymers.

Examples of the combination of the two types of polymers include polystyrene-polymethylmethacrylate (PS-PMMA), polystyrene-polydimethylsiloxane (PS-PDMS), polyethylene-polyferrocenyl dimethylsilane (PS-PFS), polystyrene-polyethylene oxide (PS-PEO), polystyrene-polyvinylpyridine (PS-PVP), polyethylene-polyhydroxystyrene (PS-PHOST), and polymethyl methacrylate-polymethacrylate containing polyhedral oligomeric silsesquioxane (PMMA-PMAPOSS).

In the above, one of the two types of copolymers is an example of the first copolymer in the present invention. The other of the two types of copolymers is an example of the second copolymer in the present invention.

The directed self-assembly material may include three types of copolymers. For instance, the directed self-assembly material may be a block copolymer generated by combination of three types of copolymers. Alternatively, the directed self-assembly material may be a blend of three types of copolymers.

In the above, one of the three types of copolymers is an example of the first copolymer in the present invention. Another of the three types of copolymers is an example of the second copolymer in the present invention.

2. Configuration of Heat Treating Apparatus

Figure 1:
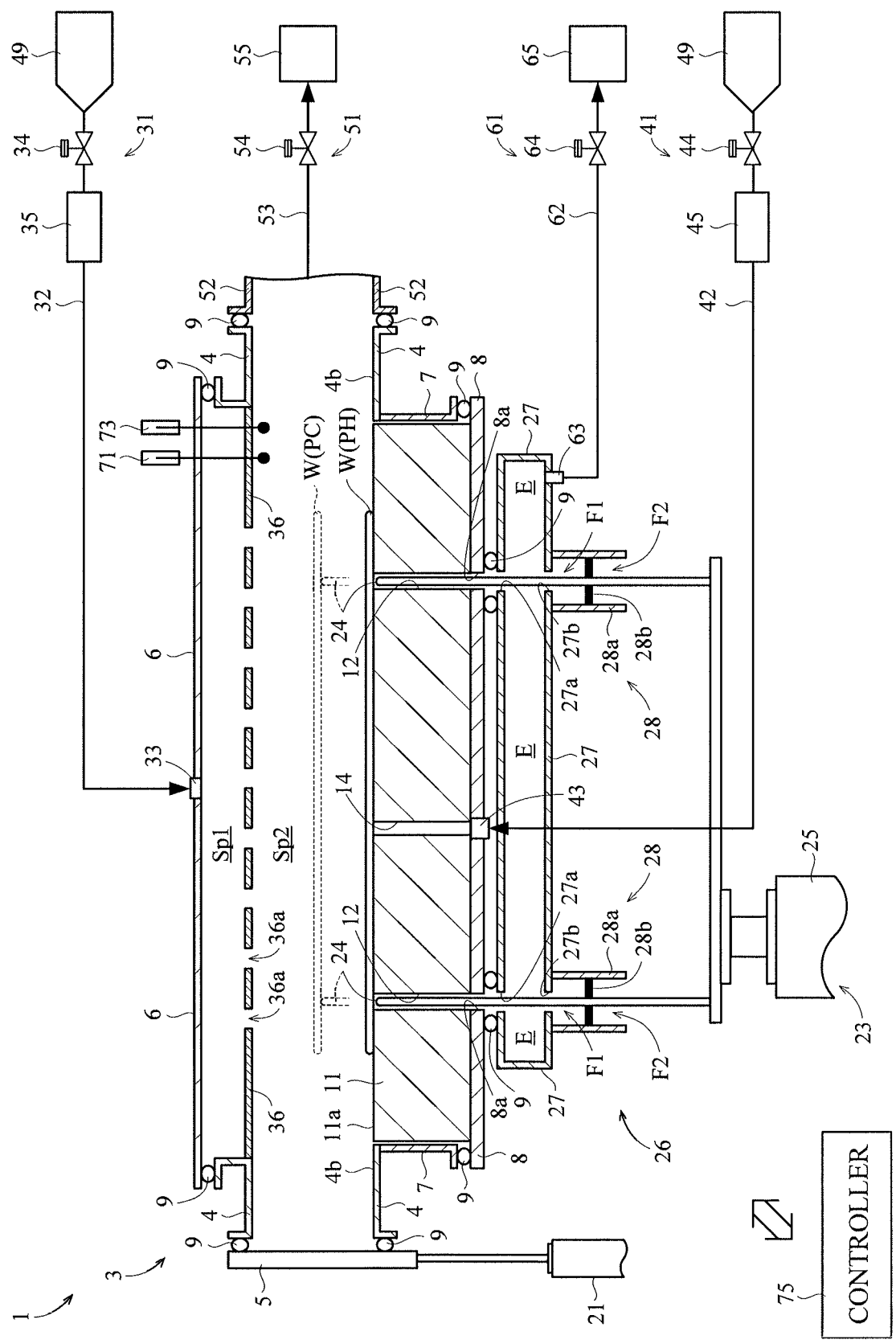
FIG. 1 schematically illustrates a configuration of a heat treating apparatus.

FIG. 1 schematically illustrates a heat treating apparatus. The heat treating apparatus 1 is able to perform the substrate treating method according to the present embodiment.

2-1. Treatment Container 3 and Heating Unit 11

The heat treating apparatus 1 includes a treatment container 3 that allows sealing. The substrate W is heated and cooled within the treatment container 3.

Figure 2:
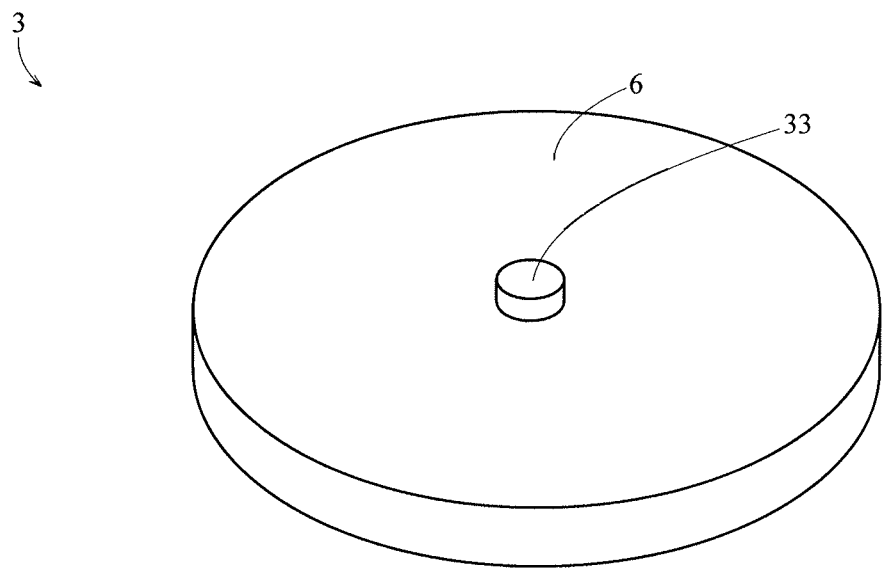
FIGS. 2 and 3 each partially illustrate an exploded perspective view of a treatment container.
Figure 2:
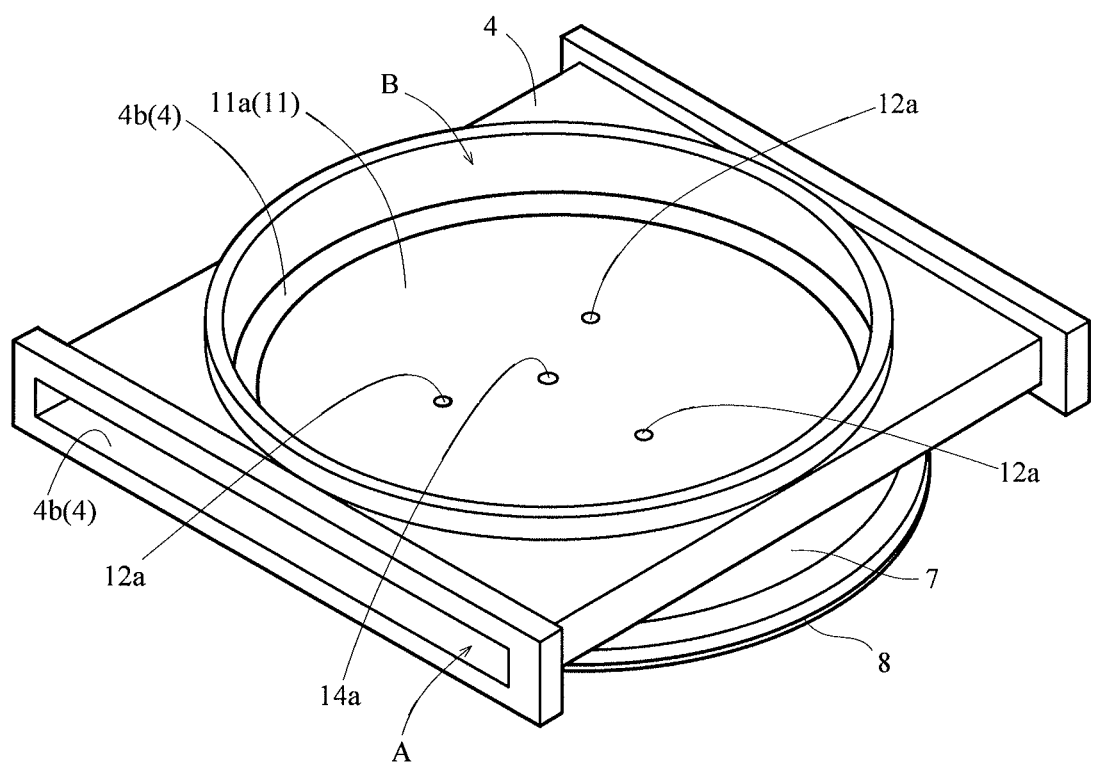
Figure 3:
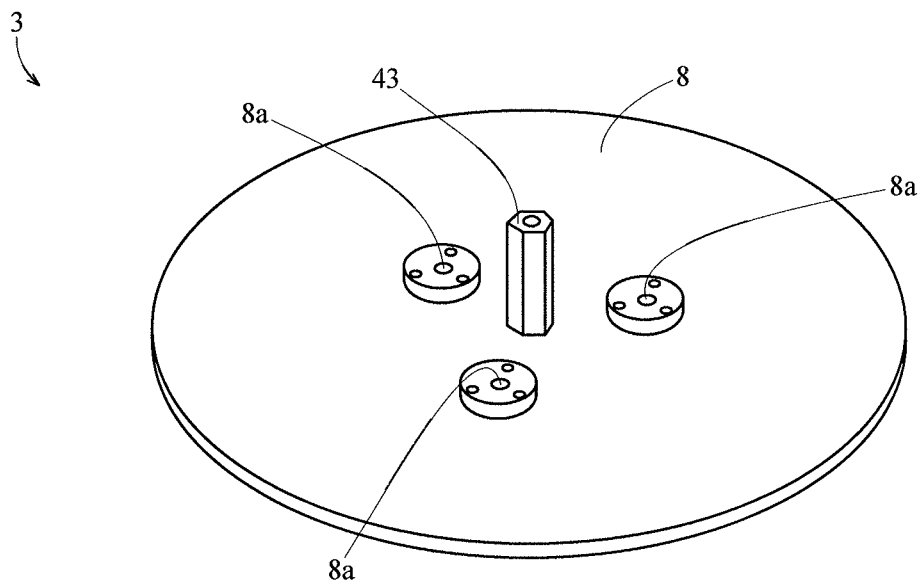
Figure 3:
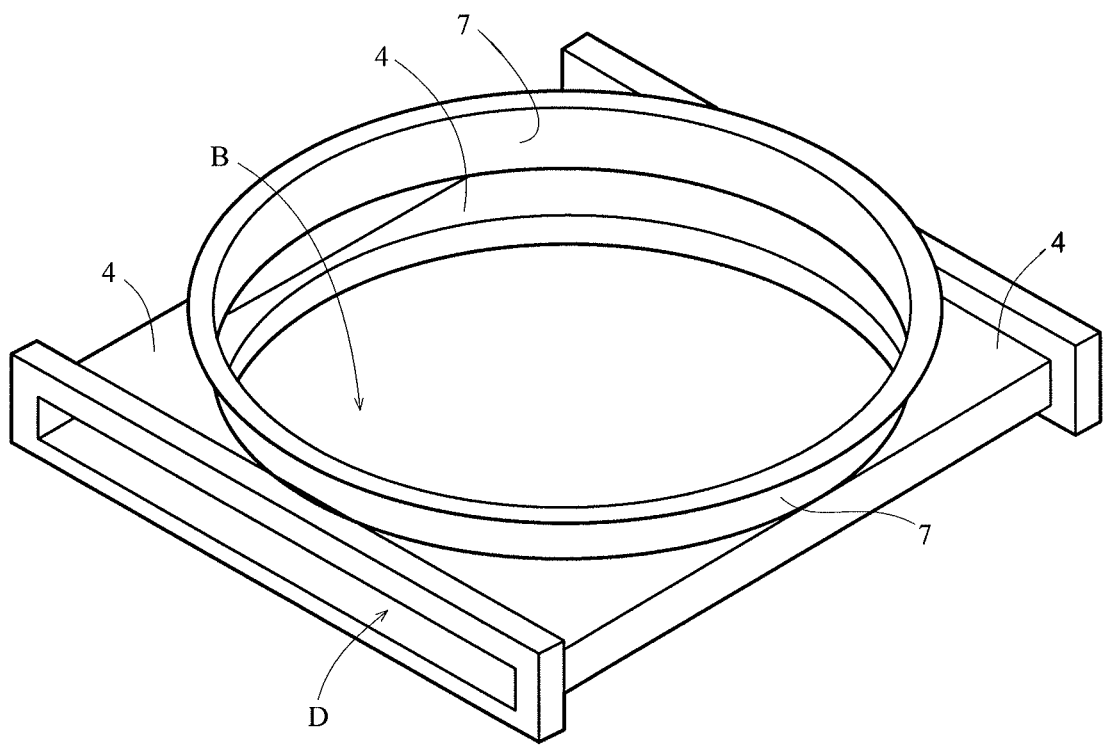

Reference is made to FIGS. 1 to 3. FIG. 2 is a partial exploded perspective view of the treatment container 3. FIG. 3 is another partial exploded perspective view of the treatment container 3. Note that FIG. 2 is the perspective view from the top. FIG. 3 is the perspective view from the bottom.

The treatment container 3 includes a casing 4. The casing 4 is flat and has a substantially box shape. The casing 4 has a transportation port A (see FIG. 2). The transportation port A is formed on a front face of the casing 4. The transportation port A is an opening for loading the substrate W into the treatment container 3 and unloading the substrate W from the treatment container 3. The transportation port A is longitudinal in a transverse direction.

The treatment container 3 includes a shutter 5. The shutter 5 opens/closes the transportation port A. The shutter 5 is removably attached to a front part of the casing 4. The shutter 5 is able to adhere to the casing 4 via seal members 9. The seal members 9 are disposed around the transportation port A. The seal members 9 are, for example, made of synthetic resin. The seal members 9 are, for example, O-rings. The shutter 5 is brought into tight contact with the casing 4, whereby the transportation port A is sealed. The shutter 5 is separated from the casing 4, whereby the transportation port A is opened.

The casing 4 has an opening B (see FIG. 2). The opening B is formed on the top face of the casing 4. The opening B has a substantially circular shape, for example.

The treatment container 3 has a lid 6. The lid 6 opens/closes the opening B. The lid 6 is removably attached to the upper part of the casing 4. The lid 6 is able to adhere to the casing 4 via the seal members 9. The seal members 9 are disposed around the opening B. The lid 6 is brought into tight contact with the casing 4, whereby the opening B is sealed. The lid 6 is separated from the casing 4, whereby the opening B is opened.

The treatment container 3 includes a housing unit 7 and a base board 8. The housing unit 7 is connected to a lower surface of the casing 4. The housing unit 7 is, for example, substantially cylindrical. The interior of the housing unit 7 is opened to the interior of the casing 4. That is, the interior of the housing unit 7 is in communication with the interior of the casing 4. The housing unit 7 extends downwardly from the lower surface of the casing 4. The housing unit 7 has a lower end that is opened. The base board 8 is attached to the lower end of the housing unit 7. The base board 8 adheres to the lower end of the housing unit 7 via a seal member 9. The base board 8 is brought into tight contact with the housing unit 7, whereby the lower end of the housing unit 7 is sealed.

The heat treating apparatus 1 includes a heating unit 11. The heating unit 11 heats the substrate W. The heating unit 11 is able to heat the substrate W at relatively higher temperatures. For instance, the heating unit 11 is able to heat the substrate W at 300° C. or higher. For instance, the heating unit 11 is able to heat the substrate W at a temperature higher than a glass transition point of the directed self-assembly material. In addition, the heating unit 11 regulates the temperature for heating the substrate W.

The heating unit 11 is disposed within the treatment container 3. The heating unit 11 is placed on the base board 8. The heating unit 11 is disposed inside of the housing unit 7. The heating unit 11 is substantially discal. The heating unit 11 has an external diameter slightly smaller than an internal diameter of the housing unit 7. Accordingly, a clearance is sufficiently small between the housing unit 7 and the heating unit 11.

The heating unit 11 has a top face 11a that is substantially flat. The top face 11a of the heating unit 11 is located at the same level as an interior bottom face 4b of the casing 4 (see FIG. 1).

The heating unit 11 includes, for example, a temperature regulator and a plate (each not shown). The temperature regulator generates heat. Moreover, the temperature regulator regulates the temperature for heating the substrate W. The temperature regulator is, for example, a heater. The temperature regulator is attached to the plate. For instance, the temperature regulator is disposed on or inside the plate. The plate has the substrate W placed thereon. The plate transmits the heat generated by the temperature regulator to the substrate placed thereon. The plate is made of metal, for example.

The substrate W is located in a heating position PH and a cooling position PC within the treatment container 3. FIG. 1 illustrates a substrate W in the heating position PH by solid lines. FIG. 1 illustrates a substrate W in the cooling position PC by dotted lines. The heating position PH is a position of the substrate W that contacts the heating unit 11. Specifically, the heating position PH is the position of the substrate W that contacts the top face 11a of the heating unit 11. The cooling position PC is the position of the substrate W further away from the heating unit 11 than the heating position PH. Specifically, the cooling position PC is above the heating position PH. When the substrate W is located at the cooling position PC, the substrate W does not contact the heating unit 11. It should be noted that both the heating position PH and the cooling position PC are positions of the substrate W within the treatment container 3.

The casing 4 has a lateral outlet D (see FIG. 3). The lateral outlet D is formed on a rear face of the casing 4. The lateral outlet D is an opening for exhausting gas within the treatment container 3. The lateral outlet D is located laterally of the cooling position PC.

Figure 4:
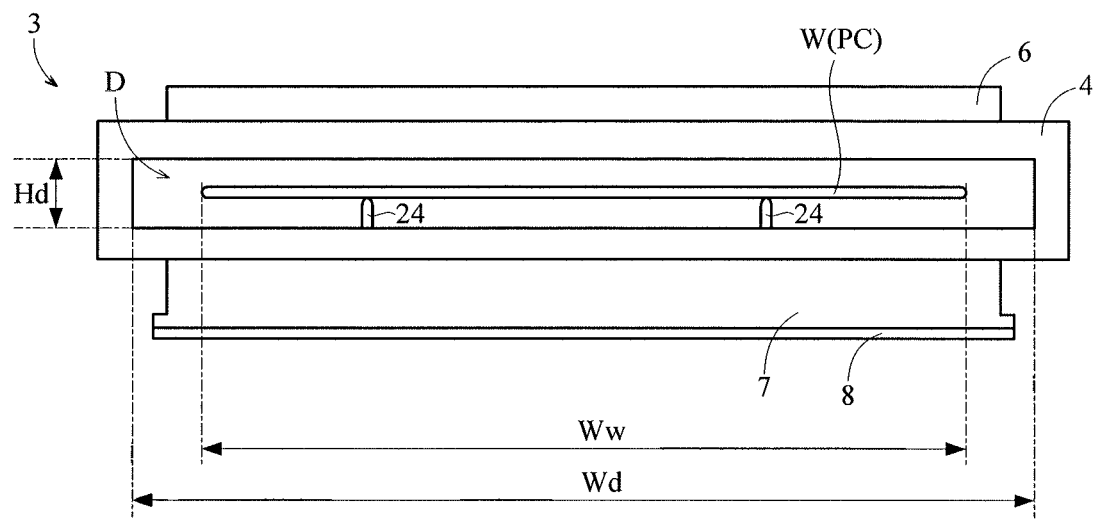
FIG. 4 illustrates a positional relationship between a lateral outlet and a substrate in a cooling position in rear view.

FIG. 4 is a positional relationship between the lateral outlet D and the substrate W in the cooling position PC in rear view. The lateral outlet D overlaps the entire of the substrate W in the cooling position PC in rear view. Accordingly, the entire of the substrate W in the cooling position PC is visible through the lateral outlet D in rear view. The lateral outlet D is disposed at a level substantially equal to that of the substrate W in the cooling position PC. Here, the lateral outlet D has a width Wd larger than a width Ww of the substrate W. The width Ww of the substrate W corresponds to a diameter of the substrate W.

The lateral outlet D has a size substantially equal to the interior of the casing 4. Specifically, the width Wd of the lateral outlet D is substantially equal to a width of the interior of the casing 4. The lateral outlet D has a height Hd substantially equal to a height of the interior of the casing 4.

The lateral outlet D is elongated in the transverse direction. The width Wd of the lateral outlet D is larger than the height Hd of the lateral outlet D. The width Wd is ten times or more larger than the height Hd.

2-2. Shutter Drive Mechanism 21

Reference is made to FIG. 1. The heat treating apparatus 1 includes a shutter drive mechanism 21. The shutter drive mechanism 21 moves the shutter 5 to removably attach the shutter 5 to the casing 4. The shutter drive mechanism 21 is disposed externally of the treatment container 3. The shutter drive mechanism 21 includes an air cylinder, for example.

2-3. Substrate Moving Mechanism 23 and Sealing Mechanism 26

The heat treating apparatus 1 includes a substrate moving mechanism 23. The substrate moving mechanism 23 moves the substrate W between the heating position PH and the cooling position PC.

The substrate moving mechanism 23 includes a plurality of (e.g., three) support pins 24. The support pins 24 support the substrate W. The support pins 24 are disposed internally and externally of the treatment container 3. The support pins 24 pass through the base board 8 via openings 8a formed in the base board 8. The support pins 24 each have a lower part externally of (below) the treatment container 3. The support pins 24 each have an upper part internally of the treatment container 3. The upper part of the support pin 24 is disposed within a support pin hole 12. The support pin hole 12 is a through hole formed internally of the heating unit 11. The support pin hole 12 is opened above the heating unit 11. The support pin hole 12 has an upper end corresponding to the opening 12a on the top face 11a of the heating unit 11 (see FIG. 2). The opening 12a is one example of the heating unit outlet in the present invention.

The substrate moving mechanism 23 includes a support pin drive mechanism 25. The support pin drive mechanism 25 moves the support pins 24 upwardly/downwardly. The support pin drive mechanism 25 is disposed externally of the treatment container 3. The support pin drive mechanism 25 is connected to the lower parts of the support pins 24. Upward/downward movement of the support pins 24 causes the substrate W to move between the heating position PH and the cooling position PC. The support pin drive mechanism 25 includes an air cylinder, for example.

The heat treating apparatus 1 includes a sealing mechanism 26. The sealing mechanism 26 seals the openings 8a of the base board 8. The sealing mechanism 26 is disposed externally of the treatment container 3.

The sealing mechanism 26 includes an aggregated part 27. The aggregated part 27 has one space E inside thereof.

Figure 5:
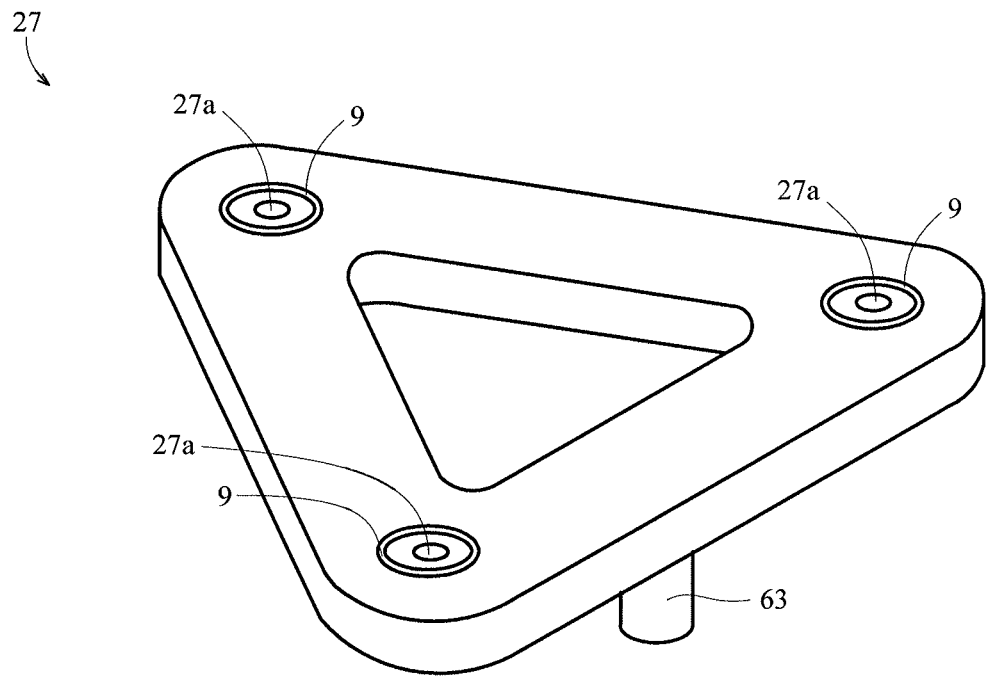
FIG. 5 is a perspective view of an aggregated part.

Reference is made to FIGS. 1 and 5. FIG. 5 is a perspective view of the aggregated part 27. The aggregated part 27 is substantially triangular annular. The aggregated part 27 has a plurality of (e.g., three) openings 27a on its top face.

Reference is made to FIG. 1. The aggregated part 27 includes a plurality of (e.g., three) openings 27b on its lower surface. The openings 27a and the openings 27b are each in communication with the space E. The base board 8 adheres to the top face of the aggregated part 27 via a plurality of seal members 9. The openings 8a face to the openings 27a, respectively. The seal members 9 are each disposed between the opening 8a and the opening 27a facing to each other. The openings 8a are in airtight communication with the openings 27a, respectively. The openings 8a are in airtight communication with the space E. The support pins 24 passes through the aggregated part 27 via the openings 27a and 27b.

The sealing mechanism 26 includes a plurality of (e.g., three) shaft sealing parts 28. The shaft sealing parts 28 each include an outer cylinder 28a and a seal member 28b. The outer cylinder 28a is cylindrical. The seal member 28b is disposed internally of the outer cylinder 28a. The seal member 28b is circular. The seal member 28b is made of metal.

The upper ends of the outer cylinders 28a adhere to a lower surface of the aggregated part 27. The openings 27b are in airtight communication with the interior of the outer cylinder 28a.

The support pins 24 each pass the outer cylinder 28a through the interior of the outer cylinder 28a. The seal members 28b are each slidable with the support pin 24, respectively, while adhering to an outer peripheral surface of the support pin 24. The seal members 28b each divide the interior of the outer cylinder 28a into two spaces F1 and F2. Each of the spaces F1 is above the seal member 28b. Each of the spaces F2 is below the seal member 28b. The spaces F1 and the spaces F2 are separated from each other. The spaces F1 are in airtight communication with the openings 27b, respectively. The spaces F1 are in airtight communication with the one space E. The one space E and the spaces F1 are in communication with the openings 8a. The one space E and the spaces F1 are sealed with the base board 8, the aggregated part 27, and the shaft sealing parts 28 except for portions where the one space E and the spaces F1 are opened to the openings 8a.

As noted above, the sealing mechanism 26 is brought into tight contact with the base board 8, whereby the openings 8a are each sealed.

2-4. Upper Supplying Section 31

The heat treating apparatus 1 includes an upper supplying section 31. The upper supplying section 31 supplies non-oxidizing gas into the treatment container 3. The upper supplying section 31 blows the non-oxidizing gas from a position higher than the cooling position PC. The non-oxidizing gas is, for example, inert gas. Examples of the inert gas include nitrogen gas and argon gas.

The upper supplying section 31 includes a pipe 32, a supply port 33, an on-off valve 34, and a flow amount adjusting unit 35. The pipe 32 has a first end connected to a non-oxidizing gas supplying source 49. The non-oxidizing gas supplying source 49 supplies non-oxidizing gas. The pipe 32 has a second end connected to the supply port 33. The supply port 33 is attached to the lid 6. The supply port 33 is in communication with the interior of the treatment container 3. The on-off valve 34 and the flow amount adjusting unit 35 are disposed on the pipe 32. The on-off valve 34 opens/closes a flow path of the pipe 32. The flow amount adjusting unit 35 adjusts a flow amount of the non-oxidizing gas flowing in the pipe 32. The flow amount adjusting unit 35 includes at least either a needle valve or a mass flow meter, for example.

The upper supplying section 31 includes a straightening vane 36. The straightening vane 36 is disposed interior of the treatment container 3. The straightening vane 36 is disposed on the opening B. The straightening vane 36 is disposed below the lid 6. The straightening vane 36 is disposed above the cooling position PC. The straightening vane 36 is a substantially horizontal plate. The straightening vane 36 includes a plurality of fine holes 36a. The fine hole 36a pass the straightening vane 36 vertically. The fine holes 36a correspond to the upper supply port in the present invention.

Here, a space defined by the lid 6 and the straightening vane 36 is referred to as an "introducing chamber Sp1". Moreover, a space defined by the casing 4, the shutter 5, the straightening vane 36 and the heating unit 11 is referred to as a "treatment chamber Sp2". The introducing chamber Sp1 is above the straightening vane 36. The treatment chamber Sp2 is below the straightening vane 36. The introducing chamber Sp1 and the treatment chamber Sp2 are in communication with each other via the fine holes 36a. It should be noted that both the introducing chamber Sp1 and the treatment chamber Sp2 are spaces within the treatment container 3.

The treatment chamber Sp2 is flat and is a substantially rectangular solid. The entire rear face of the treatment chamber Sp2 corresponds to the lateral outlet D.

The on-off valve 34 opens, whereby the non-oxidizing gas flows from the non-oxidizing gas supplying source 49 into the introducing chamber Sp1 through the pipe 32 and the supply port 33. In addition, the non-oxidizing gas flows from the introducing chamber Sp1 into the treatment chamber Sp2 through the fine holes 36a of the straightening vane 36. The fine holes 36a blow the non-oxidizing gas downwardly. The flow amount adjusting unit 35 adjusts a supply amount of the non-oxidizing gas supplied to the treatment container 3 by the upper supplying section 31. The on-off valve 34 closes, whereby the upper supplying section 31 stops supply of the non-oxidizing gas. Closing the on-off valve 34 causes the supply port 33 to be sealed.

2-5. Lower Supplying Section 41

The heat treating apparatus 1 includes a lower supplying section 41. The lower supplying section 41 supplies non-oxidizing gas into the treatment container 3. The lower supplying section 41 blows the non-oxidizing gas from a position lower than the cooling position PC.

The lower supplying section 41 includes a pipe 42, a port 43, an on-off valve 44, and a flow amount adjusting unit 45. The pipe 42 has a first end connected to the non-oxidizing gas supplying source 49. The pipe 42 has a second end connected to the port 43. The port 43 is attached to the base board 8. The port 43 is in communication with the interior of the treatment container 3. The on-off valve 44 and the flow amount adjusting unit 45 are disposed on the pipe 42.

The on-off valve 44 opens/closes the flow path in the pipe 42. The flow amount adjusting unit 45 adjusts a flow amount of the non-oxidizing gas flowing in the pipe 42. The flow amount adjusting unit 45 includes at least either a needle valve or a mass flow meter, for example.

The port 43 is in communication with a gas flow hole 14. The gas flow hole 14 is a through hole formed internally of the heating unit 11. The gas flow hole 14 is opened at the top face of the heating unit 11. The gas flow hole 14 has an upper end corresponding to the opening 14a formed on the top face 11a of the heating unit 11 (see FIG. 2). The opening 14a is one example of the heating unit supply port in the present invention.

The on-off valve 44 opens, whereby the non-oxidizing gas flows from the non-oxidizing gas supplying source 49 into the treatment container 3 through the pipe 42 and the port 43. In addition, the non-oxidizing gas flows into the treatment chamber Sp2 through the gas flow hole 14. The opening 14a formed on the top face 11a of the heating unit 11 blows the non-oxidizing gas upwardly. The flow amount adjusting unit 45 adjusts a supply amount of the non-oxidizing gas supplied to the treatment container 3 by the lower supplying section 41. The on-off valve 44 closes, whereby the lower supplying section 41 stops supply of the non-oxidizing gas. Closing the on-off valve 44 causes the port 43 to be sealed.

2-6. Lateral Exhaust Section 51

The heat treating apparatus 1 includes a lateral exhaust section 51. The lateral exhaust section 51 exhausts gas within the treatment container 3 to the exterior of the treatment container 3. The lateral exhaust section 51 exhausts gas through a position laterally of the cooling position PC.

The lateral exhaust section 51 includes an exhaust duct 52, an exhaust pipe 53, an on-off valve 54, and an exhaust mechanism 55. The exhaust duct 52 has a first end in airtight communication with the lateral outlet D. Specifically, the exhaust duct 52 adheres to a rear part of the casing 4 via the seal member 9. The seal member 9 is disposed around the lateral outlet D. The exhaust duct 52 has a second end in communication with the exhaust pipe 53. The on-off valve 54 is disposed on the exhaust pipe 53. The exhaust mechanism 55 is in communication with the exhaust pipe 53. The exhaust mechanism 55 sucks and exhausts gas. The exhaust mechanism 55 allows adjustment of an exhaust amount of the gas. More specifically, the exhaust mechanism 55 allows the adjustment of the exhaust amount of gas by controlling a flow amount of gas or a suction pressure of gas. The exhaust mechanism 55 is, for example, a vacuum pump, an exhaust blower, or an ejector.

The on-off valve 54 is opened and the exhaust mechanism 55 is driven, whereby the gas within the treatment container 3 is exhausted through the lateral outlet D to the exterior of the treatment container 3. This achieves smooth exhaust of the gas within the treatment chamber Sp2. Moreover, the exhaust mechanism 55 adjusts an exhaust amount of the gas by the lateral exhaust section 51. The drive of the exhaust mechanism 55 stops, whereby the lateral exhaust section 51 stops exhaust of the gas. Closing the on-off valve 54 causes the lateral outlet D to be sealed.

2-7. Lower Exhaust Section 61

The heat treating apparatus 1 includes a lower exhaust section 61. The lower exhaust section 61 exhausts gas within the treatment container 3 to the exterior of the treatment container 3. The lower exhaust section 61 exhausts the gas through a position lower than the cooling position PC.

The lower exhaust section 61 includes a pipe 62, an exhaust port 63, an on-off valve 64, and an exhaust mechanism 65. The pipe 62 has a first end connected to the exhaust port 63. The exhaust port 63 is attached to the aggregated part 27. The exhaust port 63 is in communication with a space E within an aggregated part 27. The on-off valve 64 is disposed on the pipe 62. The on-off valve 64 opens/closes a flow path in the pipe 62. The exhaust mechanism 65 is in communication with a second end of the pipe 62. The exhaust mechanism 65 sucks and exhaust gas. The exhaust mechanism 65 allows adjustment of an exhaust amount of gas. More specifically, the exhaust mechanism 65 allows the adjustment of an exhaust amount of the gas by controlling a flow amount of gas or a suction pressure of gas. The exhaust mechanism 65 is, for example, a vacuum pump, an exhaust blower, or an ejector.

The on-off valve 64 is opened and the exhaust mechanism 65 is driven, whereby the gas within the treatment container 3 is exhausted through the opening 12a formed on the top face 11a of the heating unit 1 to the exterior of the treatment container 3. Specifically, the gas within the treatment container 3 flows through the support pin hole 12, the opening 8a, the space E, the exhaust port 63, and the pipe 62, in this order. This achieves smooth exhaust of the gas within the treatment chamber Sp2 (especially gas above the heating unit 11) to the exterior of the treatment container 3. In addition, even when dust is generated within the space F1 by slide of the support pin 24 and the shaft sealing part 28, the dust passes through the space F1, the space E, the exhaust port 63, and the pipe 62, in this order. As noted above, the lower exhaust section 61 accurately prevents the dust from entering into the treatment container 3. The lower exhaust section 61 allows suitable exhaust of the dust within the spaces E and F1. Moreover, the exhaust mechanism 65 adjusts the exhaust amount of the gas by the lower exhaust section 61. Stopping drive of the exhaust mechanism 65 causes the lower exhaust section 61 to stop exhaust of gas. Closing the on-off valve 64 causes the exhaust port 63 to be sealed.

2-8. Sensor 71, 73

The heat treating apparatus 1 includes a pressure sensor 71, and an oxygen concentration sensor 73. The pressure sensor 71 detects pressure of the gas within the treatment container 3. The oxygen concentration sensor 73 detects an oxygen concentration within the treatment container 3. The oxygen concentration sensor 73 is, for example, a galvanic cell type oxygen sensor or a zirconia type oxygen sensor.

2-9. Controller 75

The heat treating apparatus 1 includes a controller 75. The controller 75 is connected to the heating unit 11, the shutter drive mechanism 21, the support pin drive mechanism 25, the on-off valves 34, 44, 54, 64, the flow amount adjusting units 35, 45, the exhaust mechanisms 55, 65, the pressure sensor 71, and the oxygen concentration sensor 73 in a communicative manner. The controller 75 receives detection results of the pressure sensor 71 and detection results of the oxygen concentration sensor 73. The controller 75 controls the heating unit 11, the shutter drive mechanism 21, the support pin drive mechanism 25, the on-off valves 34, 44, 54, 64, the flow amount adjusting units 35, 45, and the exhaust mechanisms 55, 65. The controller 75 is embodied with a central processing unit (CPU) that executes various processes, and a storage medium such as a RAM (Random-Access Memory) for a work area upon arithmetic processing and a fixed disk. The storage medium stores various types of information such as processing recipes (processing programs) for processing the substrate W and an reference value of the oxygen concentration.

3. Substrate Treating Method

Figure 6:
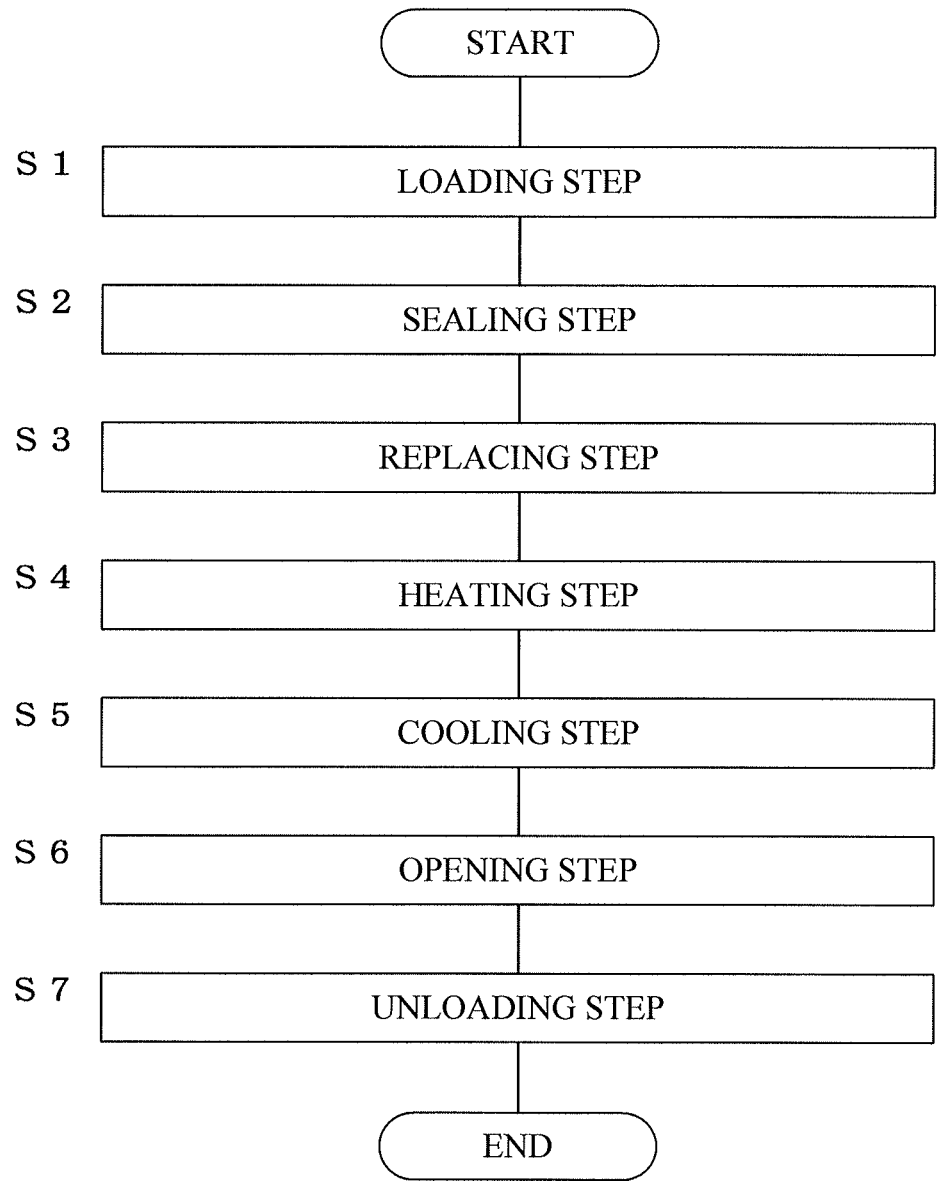
FIG. 6 is a flow chart illustrating procedures of a substrate treating method.

The following describes a substrate treating method according to the embodiment of the present invention. FIG. 6 is a flow chart illustrating procedures of the substrate treating method. The substrate treating method includes a loading step (Step S1), a sealing step (Step S2), a replacing step (Step S3), a heating step (Step S4), a cooling step (Step S5), an opening step (Step S6), and an unloading step (Step S7). Each of the steps is to be described hereunder. In the following operation example, elements are each operated through control by the controller 75.

<Step S1> Loading Step

The shutter drive mechanism 21 removes the shutter 5 from the casing 4. This opens the transportation port A. A substrate transport mechanism, not shown, loads the substrate W into the treatment container 3. Specifically, the substrate transport mechanism enters into the treatment container 3 through the transportation port A while holding the substrate W in a horizontal attitude. Accordingly, the substrate W is loaded into the treatment container 3 through the transportation port A. The substrate W has the directed self-assembly material already applied thereto. The support pin drive mechanism 25 moves the support pin 24 upwardly. The support pin 24 receives the substrate W from the substrate transport mechanism. The support pin 24 receives the substrate W at a position (hereinafter, referred to as a "deliver position") in the upper portion of the heating unit 11. Here, the deliver position may be equal in level to the cooling position PC. After the support pin 24 receives the substrate W, the substrate moving mechanism moves externally of the treatment container 3.

<Step S2> Sealing Step

The shutter drive mechanism 21 causes the shutter 5 to adhere to the casing 4. This causes the transportation port A to be sealed. The treatment container 3 is substantially sealed.

<Step S3> Replacing Step

In a replacing step, gas within the treatment container 3 is replaced by non-oxidizing gas. Specifically, the non-oxidizing gas is supplied into the treatment container 3 and the gas within the treatment container 3 is exhausted while the substrate W is on standby at the deliver position. In the replacing step, the oxygen concentration within the treatment container 3 decreases as time elapses.

Figure 7:
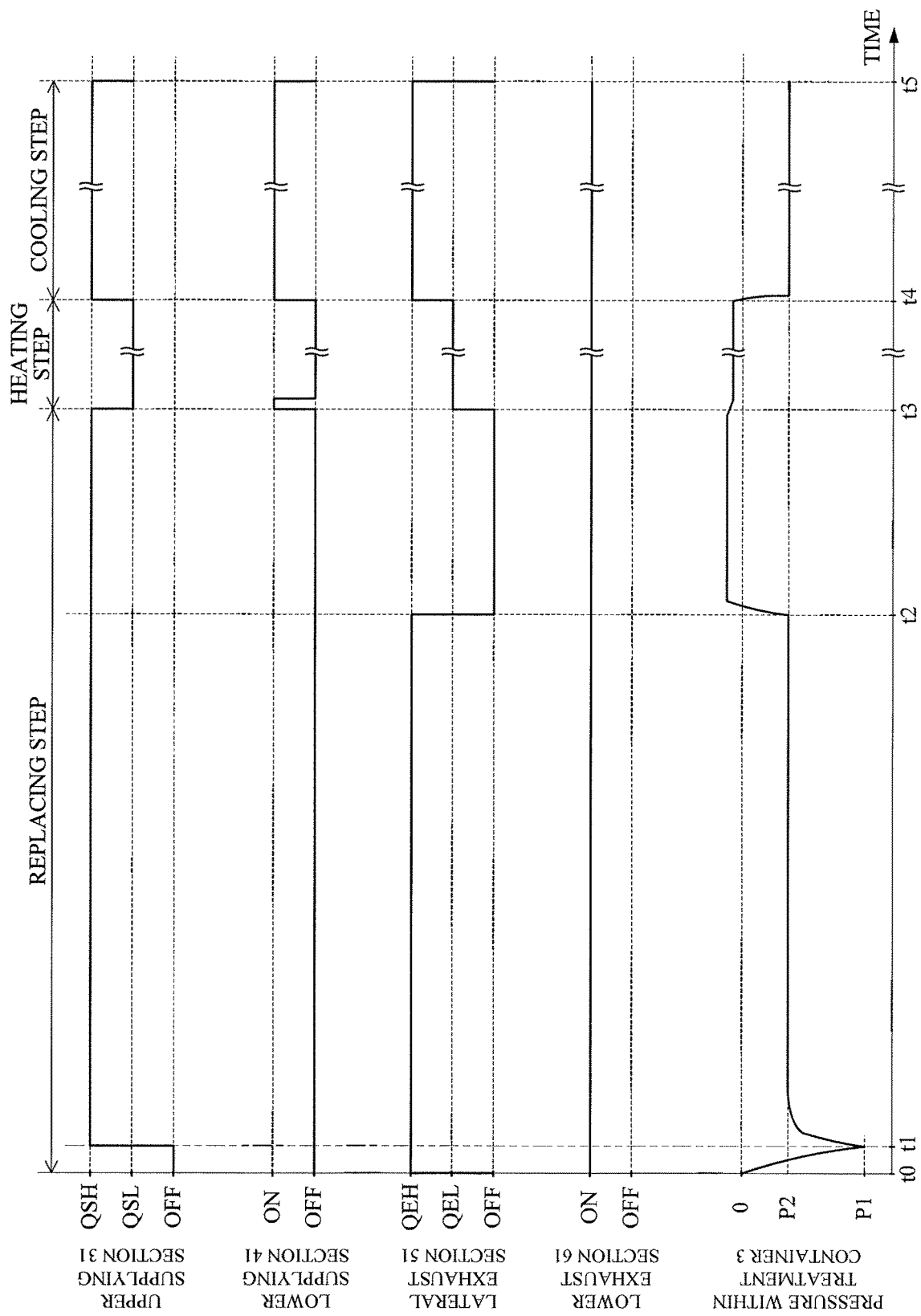
FIG. 7 is a timing chart illustrating procedures of a replacing step, a heating step, and a cooling step.

FIG. 7 is a timing chart exemplarily illustrates procedures in the replacing step, the heating step, and the cooling step. As illustrated in FIG. 7, the replacing step is performed during a period of time t0 to time t3. The replacing step includes a first process, a second process, and a third process. The first process is performed during a period of time t0 to time t1. The second process is performed during a period of time t1 to time t2. The third process is performed during a period of time t2 to time t3.

The first process performs vacuuming within the treatment container 3. Specifically, in the first process, the upper supplying section 31 and the lower supplying section 41 supply no non-oxidizing gas into the treatment container 3 while the lateral exhaust section 51 and the lower exhaust section 61 exhaust gas within the treatment container 3. The lateral exhaust section 51 exhausts gas at a relatively large exhaust amount QEH. In the first process, pressure within the treatment container 3 sharply decreases. Here, pressure p1 of the gas within the treatment container 3 at the time t1 is, for example, −30 kPa. In the present specification, pressure is represented by gauge pressure with reference to the atmospheric pressure.

In the second process, the upper supplying section 31 supplies the non-oxidizing gas into the treatment container 3, and the lower supplying section 41 supplies no non-oxidizing gas into the treatment container 3. The lateral exhaust section 51 and the lower exhaust section 61 exhaust the gas from the interior of the treatment container 3. The upper supplying section 31 supplies the non-oxidizing gas at a relatively large supply amount QSH. The lateral exhaust section 51 exhausts the gas at the exhaust amount QEH. In the second process, the pressure within the treatment container 3 is higher than the pressure p1. However, in the second process, the pressure within the treatment container 3 is still negative (i.e., lower than the atmospheric pressure). Here, pressure p2 within the treatment container 3 at the time t2 is, for example, −10 kPa.

In the third process, the upper supplying section 31 supplies the non-oxidizing gas into the treatment container 3, and the lower supplying section 41 supplies no non-oxidizing gas into the treatment container 3. The lateral exhaust section 51 exhausts no gas within the treatment container 3, and the lower exhaust section 61 exhausts the gas within the treatment container 3. The upper supplying section 31 supplies the non-oxidizing gas at the supply amount QSH. In the third process, the pressure within the treatment container 3 is higher than the pressure p2. In the third process, the pressure within the treatment container 3 is positive (i.e., higher than the atmospheric pressure).

Figure 8:
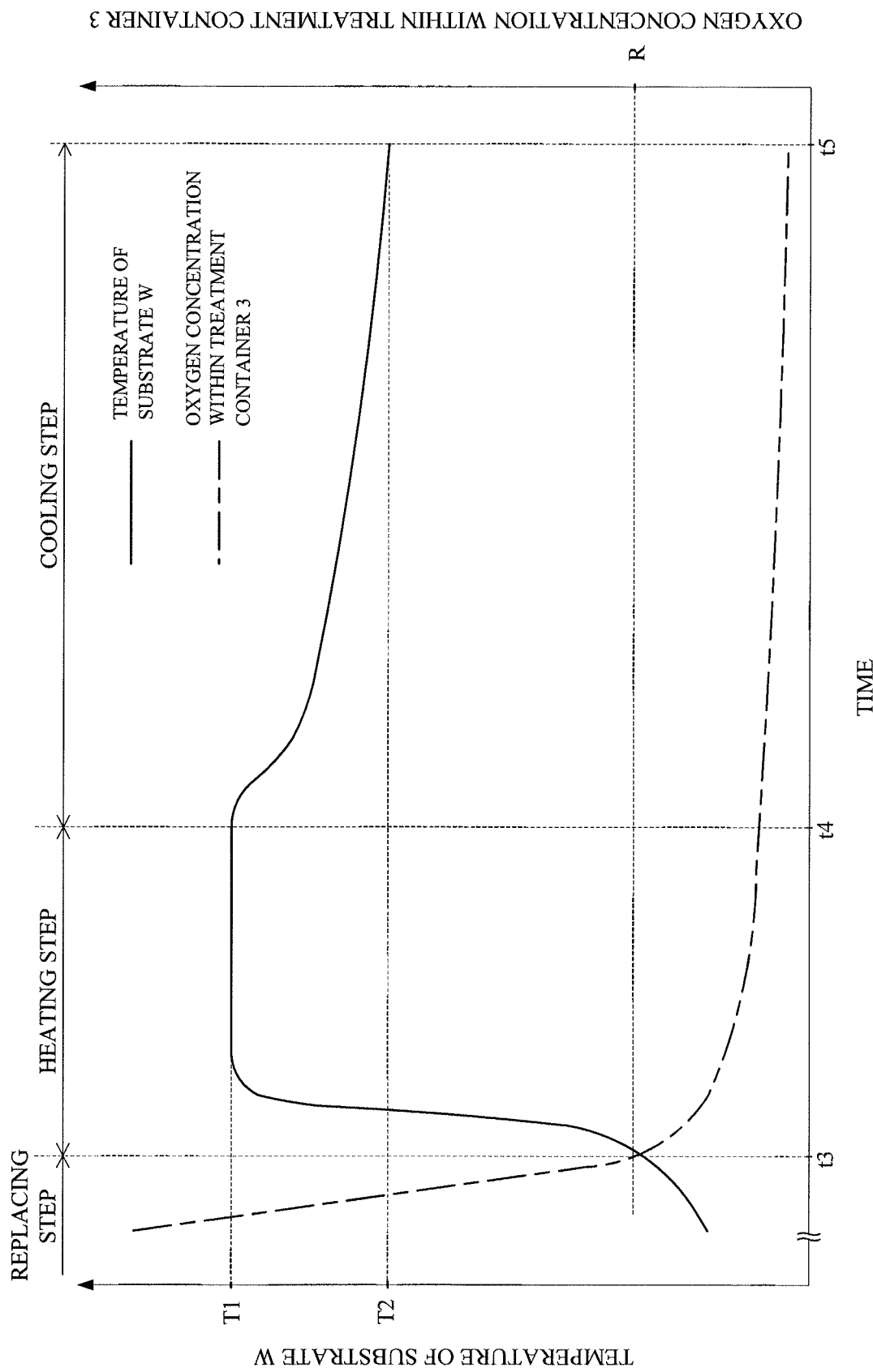
FIG. 8 is a graph illustrating time variation in temperature of a substrate and in oxygen concentration within a treatment container.

FIG. 8 is a graph illustrating time variation in temperature of the substrate W and in oxygen concentration within the treatment container 3. As illustrated, the oxygen concentration within the treatment container 3 falls to be equal to or less than a reference value R after the replacing step (i.e., at the time t3). In the present specification, the feature that the oxygen concentration within the treatment container 3 is equal to or less than the reference value R is equivalent to the feature that the interior of the treatment container 3 is under the non-oxidizing gas atmosphere.

It should be noted that the reference value R is preferably 10,000 ppm. It is more preferred that the reference value R is 1,000 ppm. It is much preferred that the reference value R is 100 ppm. Here, the oxygen concentration within the treatment container 3 corresponds to a ratio of a volume of the gas within the treatment container 3 to a volume of the oxygen gas within the treatment container 3.

<Step S4> Heating Step

Reference is made to FIG. 7. The heating step is performed during a period of time t3 to time t4. In the heating step, the interior of the treatment container 3 is maintained at the non-oxidizing gas atmosphere. Moreover, in the heating step, the upper supplying section 31 supplies the non-oxidizing gas into the treatment container 3, and the lateral exhaust section 51 and the lower exhaust section 61 exhaust gas within the treatment container 3. The upper supplying section 31 supplies the non-oxidizing gas at a supply amount QSL smaller than the supply amount QSH. The lateral exhaust section 51 exhausts the gas at an exhaust amount QEL smaller than the exhaust amount QEH. Here in the heating step, pressure within the treatment container 3 is positive.

In the heating step, the substrate W is moved to the heating position PH. Specifically, the support pin drive mechanism 25 moves the support pin 24 downwardly when the heating step starts (i.e., at the time t3). Accordingly, the substrate W is moved downwardly from the deliver position to the heating position PH. The substrate W is placed on the top face 11a of the heating unit 11. The lower supplying section 41 supplies the non-oxidizing gas into the treatment container 3 and the opening 14a formed on the top face 11a of the heating unit 11 blows the non-oxidizing gas upwardly only while the substrate W is moved from the deliver position to the heating position PH. This ensures to prevent stagnation oxygen at a clearance between the substrate W and the heating unit 11.

After the substrate W reaches the heating position PH, the substrate W is at rest at the heating position PH until the heating step is completed. After the substrate W reaches the heating position PH, the lower supplying section 41 supplies no non-oxidizing gas into the treatment container 3 until the heating step is completed. The heating unit 11 heats the substrate W at the heating position PH. Heating the substrate W causes phase separation of the directed self-assembly material on the substrate W.

Reference is made to FIG. 8. In the heating step, the oxygen concentration within the treatment container 3 is maintained at the reference value R or less. That is, in the heating step, the interior of the treatment container 3 is maintained under the non-oxidizing gas atmosphere. In the heating step, the substrate W is heated at the non-oxidizing gas atmosphere. In the heating step, the substrate W is heated at a temperature T1. Here, the temperature T1 is relatively high. For instance, the temperature T1 is 300° C. or more. The temperature T1 is, for example, a glass transition point or more of the directed self-assembly material. In the present embodiment, the temperature T1 falls within a range of 340° C. to 360° C., for example.

<Step S5> Cooling Step

Reference is made to FIG. 7. The cooling step is performed during a period of time t4 to time t5. Also in the cooling step, the interior of the treatment container 3 is maintained at the non-oxidizing gas atmosphere.

In the cooling step, the non-oxidizing gas is supplied into the treatment container 3 by a supply amount higher than that in the heating step. Specifically, the upper supplying section 31 and the lower supplying section 41 supply the non-oxidizing gas into the treatment container 3. The upper supplying section 31 supplies the non-oxidizing gas at a supply amount QSH.

In the cooling step, the gas within the treatment container 3 is exhausted by an exhaust amount higher than that in the heating step. Specifically, the lateral exhaust section 51 and the lower exhaust section 61 exhaust the gas within the treatment container 3. The lateral exhaust section 51 exhaust the gas at the exhaust amount QEH.

In the cooling step, pressure within the treatment container 3 is negative.

In the cooling step, the substrate W is located at the cooling position PC. Specifically, the support pin drive mechanism 25 moves the support pins 24 upwardly when the cooling step starts (i.e., at the time t4). This causes the substrate W to be moved from the heating position PH to the cooling position PC. After the substrate W reaches the cooling position PC, the substrate W is at rest at the cooling position PC until the cooling step is completed.

Figure 9:
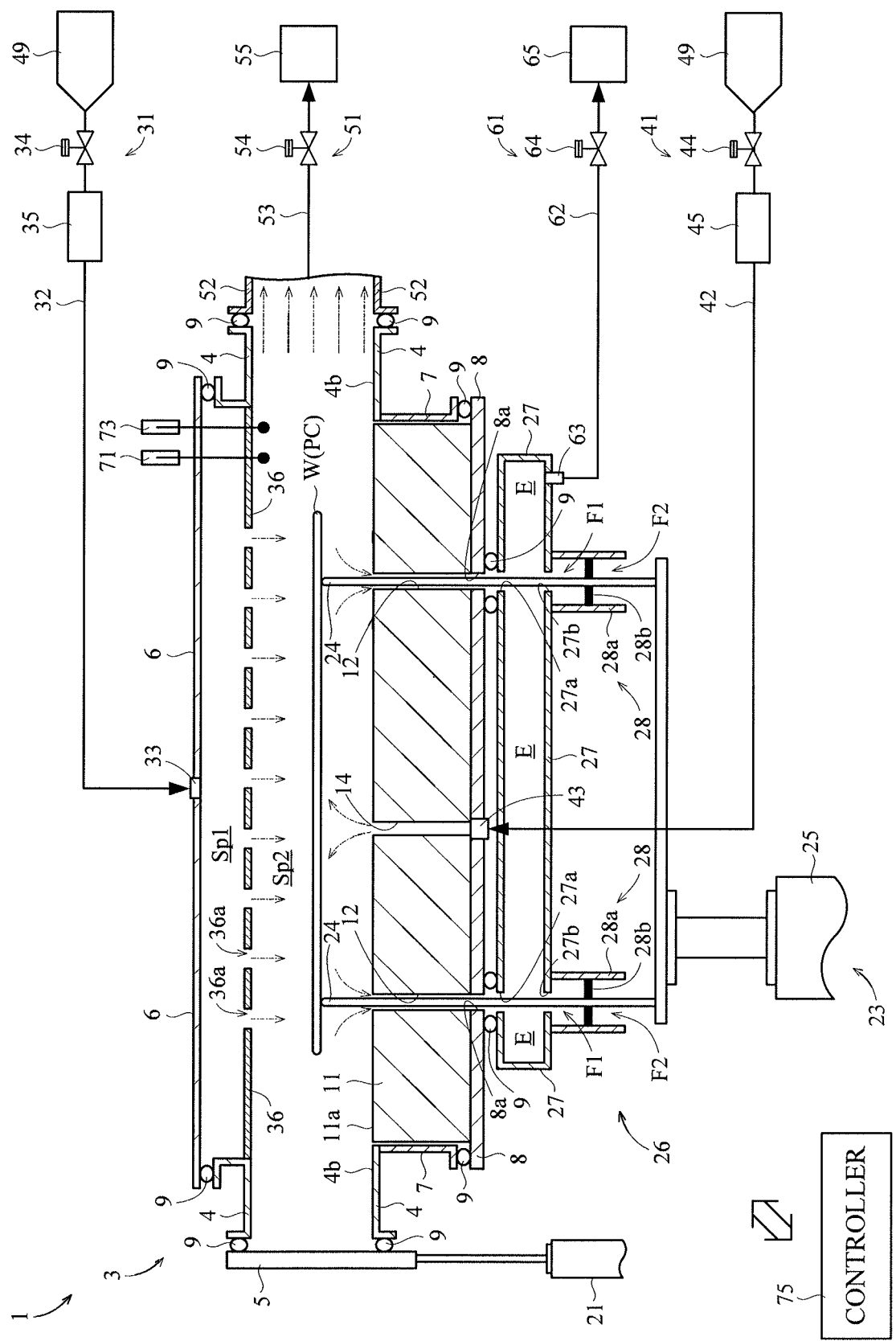
FIG. 9 schematically illustrates the heat treating apparatus in the cooling step.

FIG. 9 schematically illustrates the heat treating apparatus in the cooling step. FIG. 9 schematically illustrates flow of the non-oxidizing gas to be supplied into the treatment container 3 and flow of the gas within the treatment container 3 to be exhausted by alternate long and short dashed lines.

The upper supplying section 31 blows the non-oxidizing gas from fine holes 36a located above the cooling position PC. The fine holes 36a blow the non-oxidizing gas downwardly. That is, the fine holes 36a blow the non-oxidizing gas toward the substrate W in the cooling position PC. The fine holes 36a blow the non-oxidizing gas toward the entire top face of the substrate W.

The lower supplying section 41 blows the non-oxidizing gas through the opening 14a formed on the top face 11a of the heating unit 11. That is, the opening 14a blows the non-oxidizing gas from the position below the cooling position PC. The opening 14a blows the non-oxidizing gas upwardly. That is, the opening 14a blows the non-oxidizing gas toward the substrate W in the cooling position PC. The opening 14a blows the non-oxidizing gas toward the back side of the substrate W in the cooling position PC.

The lateral exhaust section 51 exhausts the gas within the treatment container 3 through the lateral outlet D disposed laterally of the cooling position PC. The lateral outlet D sucks the gas contacting the top face of the substrate W and the gas contacting the back side of the substrate W.

The lower exhaust section 61 exhausts the gas within the treatment container 3 through the opening 12a formed on the top face 11a of the heating unit 11. That is, the lower exhaust section 61 exhausts the gas within the treatment container 3 through the opening 12a disposed below the cooling position PC. Not only the lateral outlet D but also the opening 12a suck the gas contacting the back side of the substrate W.

Reference is made to FIG. 8. Also in the cooling step, the oxygen concentration within the treatment container 3 is maintained at the reference value R or less. That is, also in the cooling step, the interior of the treatment container 3 is maintained under the non-oxidizing gas atmosphere. In the cooling step, the substrate W is cooled at the non-oxidizing gas atmosphere.

In the cooling step, the temperature of the substrate W is decreased to the temperature T2 or less. Here, the temperature T2 is lower than the temperature T1. In the cooling step, all regions of the substrate W are preferably cooled to the temperature T2 or less when the regions of the substrate W have different temperatures (e.g., when the substrate W includes regions whose temperatures decrease relatively rapidly and regions whose temperatures decrease relatively slowly).

It is preferred that the temperature T2 is a temperature of the substrate W at which no structure of the phase separated directed self-assembly material substantially degrades or collapses even when the substrate W contacts gas whose oxygen concentration is almost equal to atmospheres. For instance, it is preferred that the temperature T2 is equal to or less than the glass transition point of the directed self-assembly material. For instance, it is preferred that the temperature T2 is equal to or less than the glass transition point of the copolymer contained in the directed self-assembly material. For instance, it is preferred that the temperature T2 is equal to or less than at least either the glass transition point of the first copolymer or the glass transition point of the second copolymer contained in the directed self-assembly material. Here, the glass transition point may be specified with literature values. Alternatively, the glass transition point may be specified by a differential scanning calorimetry (DSC). In the present embodiment, the temperature T2 falls within a range of 240° C. to 260° C.

Before the substrate treating method is executed, a time involved for the cooling step (i.e., a period of time t4 to t5) is determined through examinations or simulations, and the determined time is set in the processing recipes. Accordingly, in the substrate treating method, the cooling step is completed when time set in the processing recipes elapses after the cooling step starts. The time involved for the cooling step falls within a range of 200 to 300 seconds, for example.

<Step S6> Opening Step

Reference is made to FIG. 1. The shutter drive mechanism 21 removes the shutter 5 from the casing 4. This opens the transportation port A. The treatment container 3 is opened.

<Step S7> Unloading Step

The substrate transport mechanism, not show, unloads the substrate W from the treatment container 3. Specifically, the substrate transport mechanism enters into the treatment container 3 through the transportation port A. The support pin drive mechanism 25 moves the support pins 24 downwardly. The substrate transport mechanism receives the substrate W from the support pins 24. Thereafter, the substrate moving mechanism moves externally of the treatment container 3.

4. Effect of Embodiment

The substrate treating method according to the embodiment produces the following effects as under.

The substrate treating method includes the heating step. In the heating step, the interior of the treatment container is maintained under the non-oxidizing gas atmosphere, and the substrate is located at the heating position. Accordingly, the heating step heats the substrate at the non-oxidizing gas atmosphere. Consequently, the heating step allows the directed self-assembly material to undergo satisfied phase separation while preventing oxidization of the directed self-assembly material on the substrate. Such phase separation obtains the directed self-assembly material having highly regulated structure.

The substrate treating method includes the cooling step. In the cooling step, the interior of the treatment container 3 is maintained under the non-oxidizing gas atmosphere, and the substrate W is located at the cooling position PC. Accordingly, in the cooling step, the substrate is cooled at the non-oxidizing gas atmosphere. In the cooling step, the phase separated structure of the directed self-assembly material is able to be maintained suitably. Specifically, cooling step allows suitably prevention of degradation or collapse of the directed self-assembly material having high regulated structure. Since the substrate treating method includes the cooling step mentioned above, the structure of the phase separated directed self-assembly material is suitably protectable even when the heating step heats the substrate W at high temperatures.

As above, since the substrate treating method includes the heating step and the cooling step, the directed self-assembly material is able to undergo suitable phase separation even when the substrate W with the directed self-assembly material applied thereto is heated at high temperatures.

In addition, the cooling step supplies the non-oxidizing gas within the treatment container 3, and exhausts the gas within the treatment container 3. This allows the cooling step to perform effective cooling of the substrate W.

In the cooling step, the substrate W is cooled until the temperature of the substrate W decreases to be the temperature T2 or less. For instance, the temperature T2 is a temperature of the substrate W at which no structure of the phase separated directed self-assembly material substantially degrades or collapses even when the substrate W contacts the gas whose oxygen concentration is almost equal to the atmospheres. Consequently, the structure of the phase separated directed self-assembly material is able to be maintained suitably not only during but also after the cooling step.

In addition, the temperature T2 is equal to or less than the glass transition point of the directed self-assembly material. Consequently, the structure of the phase separated directed self-assembly material is able to be maintained suitably during and after the cooling step.

Moreover, the temperature T2 is equal to or less than the glass transition point of the copolymer contained in the directed self-assembly material. Consequently, the structure in which the copolymer is regularly arranged is able to be maintained suitably during and after the cooling step.

Moreover, the temperature T2 is equal to or less than at least either the glass transition point of the first copolymer or the glass transition point of the second copolymer contained in the directed self-assembly material. Consequently, the structure in which the first and second copolymers are regularly arranged is able to be maintained suitably during and after the cooling step.

In the heating step, the substrate W is heated to the relatively high temperature T1. Even under such a case, the substrate treating method includes the cooling step mentioned above, and thus the structure of the phase separated directed self-assembly material is able to be maintained suitably. In other words, the substrate treating method produces a higher utility as the temperature for heating the substrate W increases in the heating step.

In the cooling step, the oxygen concentration within the treatment container 3 is maintained at the reference value R or less. When the reference value R is 10,000 ppm, for example, the structure of the phase separated directed self-assembly material is protectable suitably from degradation or collapse in the cooling step. When the reference value R is 1,000 ppm, for example, the structure of the phase separated directed self-assembly material is protectable more suitably. When the reference value R is 100 ppm, for example, the structure of the phase separated directed self-assembly material is protectable much more suitably.

The non-oxidizing gas is, for example, inert gas. In such a case, the substrate W is heated at the inert gas atmosphere in the heating step. Accordingly, the heating step allows suitable prevention of oxidization of the directed self-assembly material. In addition, the substrate W is cooled at the inert gas atmosphere in the cooling step. Accordingly, the cooling step allows suitable protection of the structure of the phase separated directed self-assembly material.

The supply amount of the non-oxidizing gas is larger in the cooling step than in the heating step. Accordingly, the gas flows relatively strongly within the treatment container 3 in the cooling step. Consequently, the cooling step allows promotion of heat radiation of the substrate W, leading to short-time cooling of the substrate W. Moreover, the supply amount of the non-oxidizing gas is smaller in the heating step than in the cooling step. Accordingly, the gas flows relatively weakly within the treatment container 3 in the heating step. Consequently, the heating step allows uniform heating to the entire surface of the substrate W.

The exhaust amount of the gas within the treatment container 3 is larger in the cooling step than in the heating step. Accordingly, the gas flows relatively strongly within the treatment container 3 in the cooling step. Consequently, the cooling step allows promotion of heat radiation of the substrate W, leading to short-time cooling of the substrate W. Moreover, the exhaust amount of the gas within the treatment container 3 is smaller in the heating step than in the cooling step. Accordingly, the gas flows relatively weaker within the treatment container 3 in the heating step. Consequently, the heating step allows uniform heating to the entire surface of the substrate W.

In the cooling step, the pressure within the treatment container 3 is negative. Accordingly, the connecting parts of the treatment container 3 adhere in a more air-tight manner. Here, the connecting parts of the treatment container 3 are, for example, a connecting part of the casing 4 and the shutter 5, a connecting part of the casing 4 and the lid 6, a connecting part of the housing unit 7 and the base board 8, and a connecting part of the casing 4 and the exhaust duct 52. As a result, much higher air tightness of the treatment container 3 is obtainable. This ensures to prevent the gas external of the treatment container 3 from entering into the treatment container 3 more satisfactorily. Consequently, the cooling step achieves the maintained non-oxidizing gas atmosphere within the treatment container 3 more easily.

The heating position PH is a position where the substrate W contacts the top face 11a of the heating unit 11. Accordingly, the heating unit 11 suitably heats the substrate W when the substrate W is located at the heating position PH. Moreover, the cooling position PC is above the heating position PH. Accordingly, the cooling position PC is further away from the heating unit 11 than the heating position PH. Consequently, the substrate W is suitably cooled when the substrate W is located at the cooling position PC.

In the cooling step, the fine holes 36a above the substrate W in the cooling position PC blow the non-oxidizing gas. Since the fine hole 36a are disposed above the cooling position PC, the fine holes 36a are able to blow the non-oxidizing gas suitably toward the top face of the substrate W in the cooling position PC. Consequently, the cooling step allows efficient cooling of the substrate W in the cooling position PC.

In the cooling step, the non-oxidizing gas blows through the opening 14a formed on the top face 11a of the heating unit 11. The opening 14a is located on the top face 11a of the heating unit 11, achieving blow of the non-oxidizing gas toward above the heating unit 11. This effectively suppresses stagnation gas above the heating unit 11. Accordingly, the cooling step achieves more effective cooling of the substrate W. In addition, the opening 14a is located below the cooling position PC, achieving suitable blow of the non-oxidizing gas toward the back side of the substrate W. Accordingly, the cooling step achieves more effective cooling of the substrate W in the cooling position PC.

In the cooling step in the substrate treating method, the gas within the treatment container 3 is exhausted through the lateral outlet D disposed laterally of the substrate W in the cooling position PC. Since the lateral outlet D is disposed laterally of the cooling position PC, the lateral outlet D allows smooth suction of the gas around the substrate W. Accordingly, the cooling step achieves more effective cooling of the substrate W.

Since the width Wd of the lateral outlet D is larger than the width Ww of the substrate W, the lateral outlet D allows more smooth exhaust of the gas around the substrate W. Accordingly, the cooling step achieves more effective cooling of the substrate W.

In the cooling step, the gas within the treatment container 3 is exhausted through the opening 12a formed on the top face 11a of the heating unit 11. Since the opening 12a is located on the top face 11a of the heating unit 11, the opening 12a allows suitable suction of the gas above the heating unit 11. This effectively suppresses stagnation gas above the heating unit 11. Accordingly, the cooling step achieves more effective cooling of the substrate W. Moreover, the opening 12a is located below the cooling position PC, achieving suitable suction of the gas below the substrate W. Accordingly, the cooling step achieves more effective cooling of the substrate W in the cooling position PC.

The substrate treating method includes the sealing step and the replacing step. The sealing step is completed, and thereafter the replacing step starts. Accordingly, the replacing step is performed while the transportation port A is sealed (i.e., the treatment container 3 is substantially sealed). This allows the gas within the treatment container 3 to be replaced by the non-oxidizing gas easily in the replacing step.

The heating step is performed while the treatment container 3 is substantially sealed. Accordingly, the heating step allows the maintained non-oxidizing gas atmosphere within the treatment container 3 easily. Consequently, the heating step accurately prevents oxidization of the directed self-assembly material on the substrate W.

The cooling step is performed while the treatment container 3 is substantially sealed. Accordingly, the cooling step allows the maintained non-oxidizing gas atmosphere within the treatment container 3 easily. Consequently, the cooling step suitably achieves the maintained structure of the phase separated directed self-assembly material.

The substrate treating method includes the opening step and the unloading step. The cooling step is completed, and thereafter the opening step starts. In other words, the opening step is not performed until the cooling step is completed. Accordingly, the cooling step allows the maintained non-oxidizing gas atmosphere within the treatment container 3 easily. Consequently, the cooling step suitably achieves the maintained structure of the phase separated directed self-assembly material.

The present invention is not limited to the foregoing examples, but may be modified as follows.

(1) In the embodiment mentioned above, the heating position PH is a position of the substrate W contacting the heating unit 11. However, this is not limitative. For instance, the heating position PH may be a position of the substrate W adjacent to the heating unit 11. In other words, the heating position PH may be a position of the substrate W close to the heating unit 11. That is, the heating position PH may be a position of the substrate W not contacting the heating unit 11.

(2) In the embodiment mentioned above, the heating position PH is a position where the substrate W contacts the top face 11a of the heating unit 11. However, this is not limitative. For instance, the heating position PH may be a position where the substrate W contacts a portion of the heating unit 11 except for the top face 11a.

(3) In the embodiment mentioned above, the cooling position PC is above the heating position PH. However, this is not limitative. A relative position between the heating position PH and the cooling position PC is variable appropriately. For instance, the cooling position PC may be lateral of or below the heating position PH.

(4) In the embodiment mentioned above, a plurality of fine hole 36a is provided. However, this is not limitative. The number of fine holes 36a may be one.

(5) In the embodiment mentioned above, the casing 4 is individual to the straightening vane 36. However, this is not limitative. That is, the casing 4 may be integrated with the straightening vane 36.

(6) In the embodiment mentioned above, the upper supplying section 31 blows the non-oxidizing gas from the above of the cooling position PC. However, this is not limitative. For instance, the upper supplying section 31 may blow the non-oxidizing gas from a position away from the above of the cooling position PC. In other words, the upper supplying section 31 may blow the non-oxidizing gas from a position that does not overlap the substrate W in the cooling position PC in plan view. In this modification, it is also preferred that the upper supplying section 31 blows the non-oxidizing gas from a position higher than the cooling position PC.

In the embodiment mentioned above, the fine holes 36a are disposed above the cooling position PC. However, this is not limitative. For instance, the fine holes 36a may be disposed away from the above of the cooling position PC. In other words, the fine hole 36a may be disposed at the position that does not overlap the substrate W at the cooling position PC. In the modification, it is also preferred that the fine hole 36a are disposed at a position higher than the cooling position PC.

(7) In the embodiment mentioned above, one opening 14a is provided. However, this is not limitative. That is, a plurality of openings 14a may be provided.

(8) In the embodiment mentioned above, the lower supplying section 41 blows the non-oxidizing gas through the opening 14a formed on the top face 11a of the heating unit 11. However, this is not limitative. That is, the lower supplying section 41 may blow the non-oxidizing gas through a position other than the top face 11a of the heating unit 11. For instance, the lower supplying section 41 may blow the non-oxidizing gas from an opening formed on the interior bottom face 4b of the casing 4.

(9) In the embodiment mentioned above, the lower supplying section 41 blows the non-oxidizing gas from a position below the cooling position PC. However, this is not limitative. For instance, the lower supplying section 41 may blow the non-oxidizing gas from a position away from the below of the cooling position PC. In other words, the lower supplying section 41 may blow the non-oxidizing gas from a position that does not overlap the substrate W in the cooling position PC in plan view. In the modification, it is also preferred that the lower supplying section 41 blows the non-oxidizing gas from a position lower than the cooling position PC.

In the embodiment mentioned above, the opening 14a is disposed below the cooling position PC. However, this is not limitative. For instance, the opening 14a may be disposed at a position away from the below of the cooling position PC. In other words, the opening 14a may be disposed at a position that does not overlap the substrate W in the cooling position PC in plan view. In the modification, it is also preferred that the opening 14a is disposed at a position lower than the cooling position PC.

(10) In the embodiment mentioned above, the heat treating apparatus 1 includes the lower supplying section 41. However, this is not limitative. That is, the lower supplying section 41 is omittable.

(11) In the embodiment mentioned above, the non-oxidizing gas is supplied with the gas flow hole 14. However, this is not limitative. That is, the gas within the treatment container 3 may be exhausted with the gas flow hole 14. The opening 14a of the gas flow hole 14 in the modification is one example of the heating unit outlet in the present invention.

(12) In the embodiment mentioned above, a plurality of openings 12a is provided. However, this is not limitative. That is, the number of openings 12a may be one.

(13) In the embodiment mentioned above, the lower exhaust section 61 exhausts the gas within the treatment container 3 through the opening 12a disposed on the top face 11a of the heating unit 11. However, this is not limitative. The lower exhaust section 61 may exhaust the gas within the treatment container 3 through a position other than the top face 11a of the heating unit 11. For instance, the lower exhaust section 61 may exhaust the gas within the treatment container 3 through an opening disposed on the interior bottom face 4b of the casing 4.

(14) In the embodiment mentioned above, the lower exhaust section 61 exhausts the gas within the treatment container 3 through a position below the cooling position PC. However, this is not limitative. For instance, the lower exhaust section 61 may exhaust the gas within the treatment container 3 through a position away from the below of the cooling position PC. In other words, the lower exhaust section 61 may exhaust the gas within the treatment container 3 through a position that does not overlap the substrate W in the cooling position PC in plan view. In the modification, it is also preferred that the lower exhaust section 61 exhausts the gas within the treatment container 3 through a position lower than the cooling position PC.

In the embodiment mentioned above, the opening 12a is disposed below the cooling position PC. However, this is not limitative. For instance, the opening 12a may be disposed at a position away from the below of the cooling position PC. In other words, the opening 12a may be disposed at a position that does not overlap the substrate W in the cooling position PC in plan view. In the modification, it is also preferred that the opening 12a is disposed at a position lower than the cooling position PC.

(15) In the embodiment mentioned above, the heat treating apparatus 1 includes the lower exhaust section 61. However, this is not limitative. That is, the lower exhaust section 61 is omittable.

(16) In the embodiment mentioned above, the replacing step includes the first process, the second process, and the third process. However, this is not limitative. For instance, at least any of the first process, the second process, and the third process is omittable. In the embodiment mentioned above, the replacing step performs the first process, the second process, and the third process, in this order. However, this is not limitative. That is, the order of the first process, the second process, and the third process is variable.

(17) In the embodiment mentioned above, in the cooling step, the supply amount of the non-oxidizing gas into the treatment container 3 is invariable temporally. However, this is not limitative. That is, in the cooling step, the supply amount of the non-oxidizing gas into the treatment container 3 is variable temporally. It should be noted that the supply amount of the non-oxidizing gas into the treatment container 3 is the sum of the supply amount of the non-oxidizing gas supplied into the treatment container 3 by the upper supplying section 31 (hereinafter, referred to as a "supply amount by the upper supplying section 31") and the supply amount of the non-oxidizing gas supplied into the treatment container 3 by the lower supplying section 41 (hereinafter, referred to as a "supply amount by the lower supplying section 41").

(18) In the embodiment mentioned above, the supply amount by the upper supplying section 31 is invariable temporally in the cooling step. However, this is not limitative. That is, the supply amount by the upper supplying section 31 is variable temporally in the cooling step. Likewise, the supply amount by the lower supplying section 41 is invariable temporally in the cooling step. However, this is not limitative. That is, the supply amount by the lower supplying section 41 is variable temporally in the cooling step.

(19) In the embodiment mentioned above, in the cooling step, the exhaust amount of the gas within the treatment container 3 is invariable temporally. However, this is not limitative. That is, in the cooling step, the exhaust amount of the gas within the treatment container 3 is variable temporally. It should be noted that the exhaust amount of the gas within the treatment container 3 is the sum of the exhaust amount of the gas within the treatment container 3 by the lateral exhaust section 51 (hereinafter, referred to as an "exhaust amount by the lateral exhaust section 51) and the exhaust amount of the gas within the treatment container 3 by the lower exhaust section 61 (hereinafter, referred to as an "exhaust amount by the lower exhaust section 61).

(20) In the embodiment mentioned above, the exhaust amount by the lateral exhaust section 51 is invariable temporally in the cooling step. However, this is not limitative. That is, the exhaust amount by the lateral exhaust section 51 is variable temporally in the cooling step. Likewise, the exhaust amount by the lower exhaust section 61 is invariable temporally in the cooling step. However, this is not limitative. That is, the exhaust amount by the lower exhaust section 61 is variable temporally in the cooling step.

(21) In the embodiment mentioned above, the pressure within the treatment container 3 is negative in the cooling step. However, this is not limitative. For instance, the pressure within the treatment container 3 may be equal to or higher than the atmospheric pressure in the cooling step.

(22) In the embodiment mentioned above, the cooling step is completed when time preset in the processing recipes elapses since the cooling step starts. However, this is not limitative. For instance, the temperature of the substrate W may be monitored in the cooling step. Specifically, the temperature of the substrate W may be detected directly in the cooling step. Alternatively, the temperature of the substrate W may be estimated in the cooling step. For instance, the temperature of the substrate W may be estimated in the cooling step in accordance with at least any of the temperature of the support pin 24 and the temperature of the gas exhausted from the treatment container 3. In addition, the cooling step may be completed when it is determined, through comparison between the temperature of the substrate W and the temperature T2, that the temperature of the substrate W detected or estimated decreases to a temperature equal to or less than the temperature T2.

(23) In the embodiment mentioned above, the upper supplying section 31 and the lower supplying section 41 supply the non-oxidizing gas into the treatment container 3 in the cooling step. However, this is not limitative. For instance, only the upper supplying section 31 may supply the non-oxidizing gas into the treatment container 3 and the lower supplying section 41 does not need to supply the non-oxidizing gas into the treatment container 3 in the cooling step.

(24) In the embodiment mentioned above, the lateral exhaust section 51 and the lower exhaust section 61 exhaust the gas within the treatment container 3 in the cooling step. However, this is not limitative. For instance, only the lateral exhaust section 51 may exhaust the gas within the treatment container 3 and the lower exhaust section 61 does not need to exhaust the gas within the treatment container 3 in the cooling step.

(25) In the embodiment mentioned above, the non-oxidizing gas is supplied into the treatment container 3 in the heating step. However, this is not limitative. That is, the non-oxidizing gas may not be supplied into the treatment container 3 in the heating step.

(26) In the embodiment mentioned above, the gas within the treatment container 3 is exhausted in the heating step.

However, this is not limitative. That is, the gas within the treatment container 3 may not be exhausted in the heating step.

(27) The present embodiments and the modifications in the above (1) to (26) are variable appropriately by replacing or combining the element of the present embodiment or the modifications with the other element thereof.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for treating a substrate with a directed self-assembly material applied thereto, the substrate treating method comprising:
    a heating step of heating the substrate to perform phase separation of the directed self-assembly material by maintaining an interior of a treatment container in a non-oxidizing gas atmosphere, and controlling a substrate moving mechanism to place the substrate at a heating position where the substrate contacts or is adjacent to a heating unit within the treatment container; and
    a cooling step of cooling the substrate by maintaining the interior of the treatment container in the non-oxidizing gas atmosphere, controlling the substrate moving mechanism to place the substrate at a cooling position further away from the heating unit than the heating position, supplying non-oxidizing gas into the treatment container, and exhausting gas within the treatment container,
    the non-oxidizing gas being supplied in the cooling step in an amount larger than an amount of non-oxidizing gas in the heating step,
    the gas within the treatment container being exhausted in the cooling step in an amount larger than an amount of gas within the treatment container in the heating step,
    pressure within the treatment container in the heating step being positive with reference to an atmospheric pressure, and
    pressure within the treatment container in the cooling step being negative with reference to the atmospheric pressure.

2. The substrate treating method according to claim 1, wherein
    the cooling step includes cooling the substrate to a temperature equal to or less than a glass transition point of the directed self-assembly material.

3. The substrate treating method according to claim 1, wherein
    the directed self-assembly material contains a first copolymer and a second copolymer,
    the heating step includes undergoing phase separation to the first copolymer and the second copolymer, and
    the cooling step includes cooling the substrate to a temperature equal to or less than at least either a glass transition point of the first copolymer or a glass transition point of the second copolymer.

4. The substrate treating method according to claim 1, wherein
    the heating step includes heating the substrate to a temperature of 300° C. or more.

5. The substrate treating method according to claim 1, wherein
    the cooling step includes keeping an oxygen concentration within the treatment container at 10,000 ppm or less.

6. The substrate treating method according to claim 1, wherein
    the cooling step includes keeping an oxygen concentration within the treatment container at 1,000 ppm or less.

7. The substrate treating method according to claim 1, wherein
    the non-oxidizing gas is inert gas.

8. The substrate treating method according to claim 1, wherein
    the heating position of the substrate is a position of the substrate where the substrate contacts a top face of the heating unit or is adjacent to the top face of the heating unit, and the cooling position of the substrate is above the heating position of the substrate.

9. The substrate treating method according to claim 1, wherein
    the cooling step includes blowing the non-oxidizing gas from an upper supply port above the substrate in the cooling position.

10. The substrate treating method according to claim 1, wherein
    the cooling step includes blowing the non-oxidizing gas from a heating unit supply port formed on the top face of the heating unit.

11. The substrate treating method according to claim 1, wherein
    the cooling step includes exhausting the gas within the treatment container through a heating unit outlet formed on the top face of the heating unit.

12. The substrate treating method according to claim 1, wherein
    the treatment container comprises:
    a casing with a transportation port through which the substrate passes, and
    a shutter that is removably attached to the casing to open/close the transportation port, the substrate treating method comprises:
    a loading step of loading the substrate into the treatment container through the transportation port;
    a sealing step of sealing the transportation port with the shutter; and
    a replacing step of replacing the gas within the treatment container by non-oxidizing gas, and
    the heating step and the cooling step are performed after the replacing step while the transportation port is sealed.

13. The substrate treating method according to claim 12, further comprising:
    an opening step of opening the transportation port; and
    an unloading step of unloading the substrate from the treatment container through the transportation port, wherein
    the opening step is performed after the cooling step.

14. The substrate treating method according to claim 1, wherein
    the cooling step includes cooling the substrate to a temperature equal to or less than a temperature at which a structure of the phase separated directed self-assembly material does not degrade or collapse substantially even when the substrate contacts the gas whose oxygen concentration is almost equal to an oxygen concentration of air.

15. The substrate treating method according to claim 1, wherein
the heating step includes heating the substrate at a temperature higher than a glass transition point of the directed self-assembly material on the substrate.

16. The substrate treating method according to claim 1, wherein
the heating step includes blowing the non-oxidizing gas from an opening formed on a top face of the heating unit upwardly while the substrate moving mechanism moves the substrate to the heating position, and
the heating step does not include blowing the non-oxidizing gas from the opening from when the substrate reaches the heating position until the heating step is completed.

17. A substrate treating method for treating a substrate with a directed self-assembly material applied thereto, the substrate treating method comprising:
a replacing step of replacing the gas within the treatment container by non-oxidizing gas;
a heating step of heating the substrate to perform phase separation of the directed self-assembly material by maintaining an interior of the treatment container in a non-oxidizing gas atmosphere, and controlling a substrate moving mechanism to place the substrate at a heating position where the substrate contacts or is adjacent to a heating unit within the treatment container; and
a cooling step of cooling the substrate by maintaining the interior of the treatment container in the non-oxidizing gas atmosphere, controlling the substrate moving mechanism to place the substrate at a cooling position further away from the heating unit than the heating position, supplying non-oxidizing gas into the treatment container, and exhausting gas within the treatment container,
the replacing step including:
a first process of not supplying the non-oxidizing gas into the treatment container but exhausting gas within the treatment container to decrease pressure within the treatment container to be negative with reference to an atmospheric pressure;
a second process of supplying the non-oxidizing gas into the treatment container and exhausting the gas within the treatment container to keep the pressure within the treatment container negative with reference to the atmospheric pressure; and
a third process of supplying the non-oxidizing gas into the treatment container and exhausting the gas within the treatment container to increase the pressure within the treatment container to be positive with reference to the atmospheric pressure,
the pressure within the treatment container in the heating step being positive with reference to the atmospheric pressure, and
the pressure within the treatment container in the cooling step being negative with reference to the atmospheric pressure.

18. The substrate treating method according to claim 17, wherein
the replacing step performs the first process, the second process, and the third process, in this order,
pressure within the treatment container at which the second process is completed is higher than pressure within the treatment container at which the first process is completed,
pressure within the treatment container at which the third process is completed is higher than pressure within the treatment container at which the second process is completed,
the non-oxidizing gas is supplied in the third process in an amount equal to an amount of the non-oxidizing gas in the second process, and
the gas within the treatment container is exhausted in the third process in an amount smaller than an amount of gas within the treatment container in the second process.

19. A substrate treating method for treating a substrate with a directed self-assembly material applied thereto, the substrate treating method comprising:
a heating step of heating the substrate to perform phase separation of the directed self-assembly material by maintaining an interior of the treatment container in a non-oxidizing gas atmosphere, and controlling a substrate moving mechanism to place the substrate at a heating position where the substrate contacts or is adjacent to a heating unit within the treatment container; and
a cooling step of cooling the substrate by maintaining the interior of the treatment container in the non-oxidizing gas atmosphere, controlling the substrate moving mechanism to place the substrate at a cooling position further away from the heating unit than the heating position, supplying non-oxidizing gas into the treatment container, and exhausting gas within the treatment container,
the cooling step including exhausting the gas within the treatment container through a lateral outlet disposed laterally of the substrate in the cooling position,
the lateral outlet overlapping an entirety of the substrate in the cooling position in lateral view.

20. The substrate treating method according to claim 19, wherein
the lateral outlet has a width larger than a width of the substrate.

\* \* \* \* \*